(12) United States Patent
Matano

(10) Patent No.: US 6,329,869 B1
(45) Date of Patent: Dec. 11, 2001

(54) SEMICONDUCTOR DEVICE WITH LESS INFLUENCE OF NOISE

(75) Inventor: Tatsuya Matano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/573,634

(22) Filed: May 17, 2000

(30) Foreign Application Priority Data

May 19, 1999 (JP) .................................................. 11-139267

(51) Int. Cl.[7] .......................................................... G05F 1/10
(52) U.S. Cl. ................................................................. 327/536
(58) Field of Search .................................. 327/534, 535, 327/536, 537

(56) References Cited

U.S. PATENT DOCUMENTS 5,946,258 * 8/1999 Evertt et al. ........................ 365/226

FOREIGN PATENT DOCUMENTS

| 8-31171 | 2/1996 | (JP) . |
| 10-255469 | 9/1998 | (JP) . |
| 12-164805 | 6/2000 | (JP) . |

OTHER PUBLICATIONS

H. Tanaka et al., "A Precise On–Chip Voltage Generator for a Giga–Scale DRAM with a Negative Word–Line Scheme", 1998 Symposium on VLSI Circuits Digest of Technical Papers, pp. 94–95 with Abstract.

* cited by examiner

Primary Examiner—Jeffrey Zweizig
(74) Attorney, Agent, or Firm—Sughrue, Mion, Zinn, Macpeak & Seas, PLLC

(57) ABSTRACT

In a semiconductor device, a voltage generating section is operatively connected with a first voltage line portion and a second voltage line portion. A first voltage detecting section detects a voltage of the first voltage line portion, and a second voltage detecting section which detects a voltage of the second voltage line portion. A control unit controls the voltage generating section based on the detecting results of the first and second voltage detecting sections such that the first voltage line portion and the second voltage line portion are respectively set to a first voltage and a second voltage. A switch section is provided between the first voltage line portion and the second voltage line portion. The switch section selectively disconnects the second voltage line portion from the first voltage line portion based on the detection result of the second voltage detecting section.

12 Claims, 29 Drawing Sheets

CHARGE PUMP CIRCUIT B

CHARGE PUMP CIRCUIT

OSCILLATOR

DETECTOR1

DETECTOR2

LEVEL-CONVERTER2

Vdet2

OUT

CHARGE PUMP CIRCUIT A

CHARGE PUMP CIRCUIT

OSCILLATOR

DETECTOR1

DETECTOR2

LEVEL-CONVERTER1

Vdet2

------ VCC
------ GND

OUT

------ VPP
------ GND

CHARGE PUMP CIRCUIT D

LEVEL-CONVERTER4

Fig. 27A Vdet2
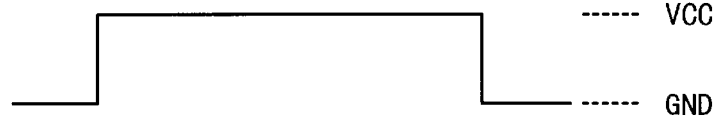
Fig. 27B A4
Fig. 27C B4
Fig. 27D OUT
Fig. 28
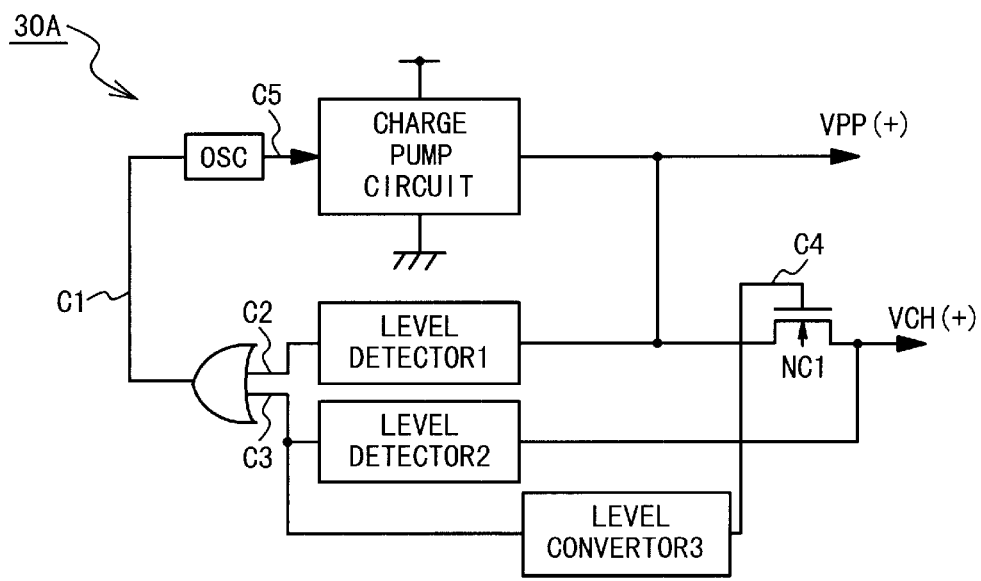
CHARGE PUMP CIRCUIT C Fig. 29
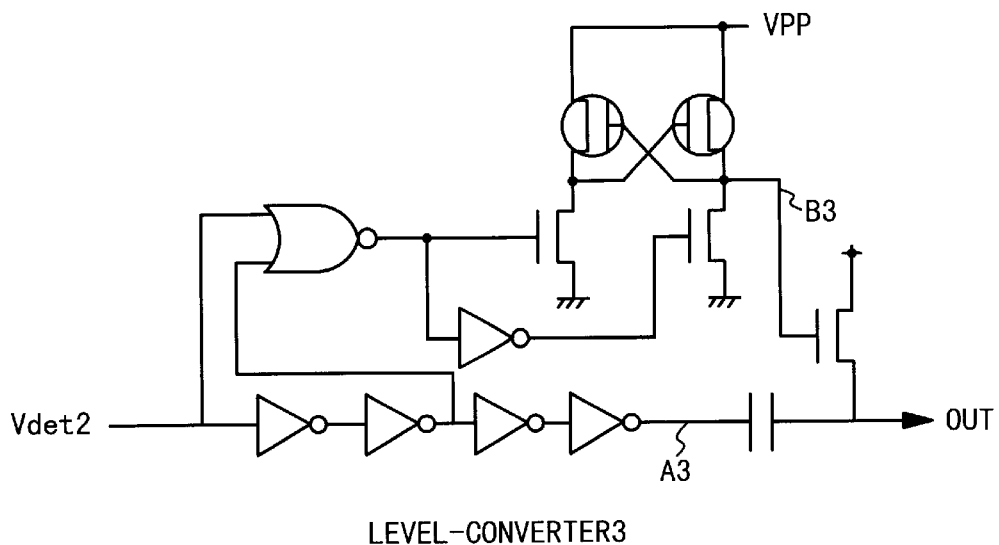
LEVEL-CONVERTER3
Fig. 30A
Vdet2
Fig. 30B
A3
Fig. 30C
B3
Fig. 30D
OUT

CHARGE PUMP CIRCUIT F

LEVEL-CONVERTER4A

LEVEL-CONVERTER4B

Fig. 36A Vdet1
Fig. 36B A4
Fig. 36C B4
Fig. 36D OUT
Fig. 37
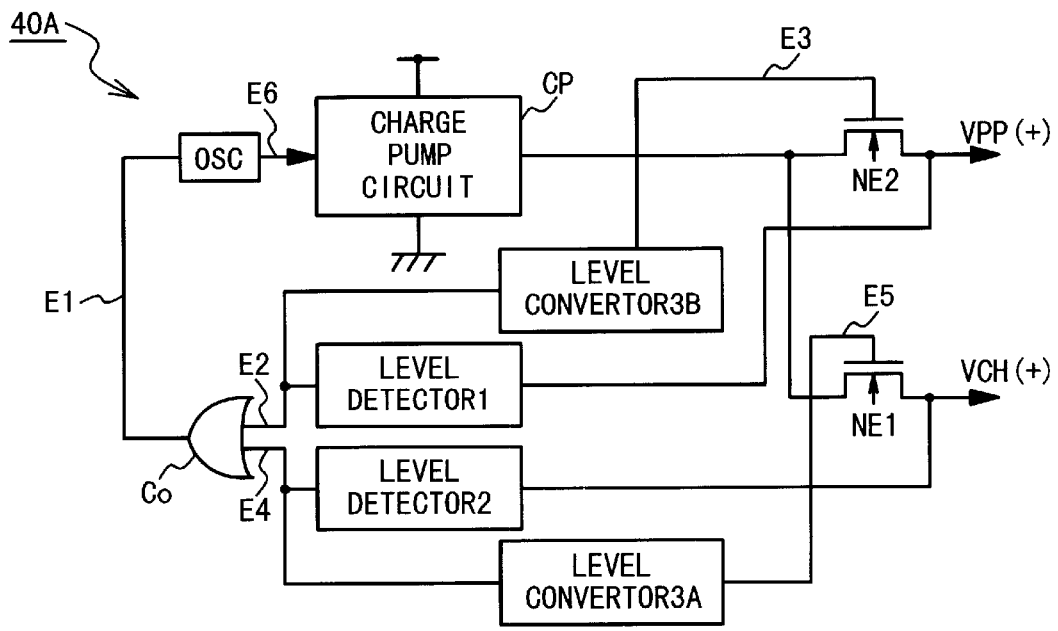
CHARGE PUMP CIRCUIT E

LEVEL-CONVERTER3A

Vdet2

A3

B3

OUT

LEVEL-CONVERTER3B

Fig. 42A Vdet1
Fig. 42B A3
Fig. 42C B3
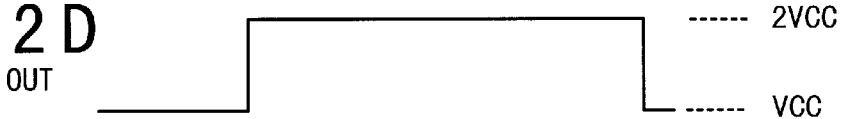
Fig. 42D OUT

SEMICONDUCTOR DEVICE WITH LESS INFLUENCE OF NOISE

BACKGROUND OF THE INVENTION

1. Field of the Invention

The present invention relates to a semiconductor device, and more particularly a semiconductor device including a power supply voltage generating unit.

2. Description of the Related Art

A power supply voltage generating unit is conventionally known in "A Precise On-Chip Voltage Generator for a Giga-Scale DRAM with a Negative Word-line Scheme" (1998 Symposium on VLSI Circuits Digest of Technical Papers, pp. 94 to 95) by Hitoshi Tanaka et al.

In Japanese Laid Open Patent application (JP-A-Heisei 10-255469) is disclosed a circuit for generating a voltage higher than a power supply voltage externally supplied and a circuit for generating a negative voltage lower than a ground voltage. In this reference, the circuit is composed of a charge pump, two level detectors and two ring oscillators. The charge pump generates an internal power supply voltage higher than the external power supply voltage. The two level detectors detects the internal power supply voltage outputted from the charge pump. The two ring oscillators are respectively connected to the two level detectors and has different oscillation frequencies. A multiple ring oscillator selectively outputs to the charge pump, the signal generated by one of the ring oscillators in accordance with the internal power supply voltage which is outputted from the charge pump.

Also, the following matters are disclosed in the above reference. A MOS-type semiconductor integrated circuit at present includes a boosting circuit, which generates the internal power supply voltage higher than the power supply voltage externally supplied. The internal power supply voltage is supplied to the inside of the semiconductor integrated circuit such that a high level signal can be propagated without decrease, even if N-type MOSFETs are used. Also, a junction capacitance of a drain node is decreased so as to accomplish a high-speed operation and small power consumption. Also, the change of a threshold voltage due to the substrate effect is reduced to extend an operation margin. For these purposes, a power supply circuit system is provided to generate the internal voltage which is lower than the ground voltage externally supplied and to supply the inside of the semiconductor integrated circuit. At this time, the above power supply circuit system is requested to detect the change of the internal voltage due to operation current and leak current, and to hold the internal voltage such that the semiconductor integrated circuit is held in the normal operation.

It should be noted that various types of current flow such as the leak current equal to or less than 100 nA which is caused through the deviation in a manufacturing process and the semiconductor physics in a stand-by state, and the operation current of order of 10 $\mu$A which is caused by the circuit structure for bias current. Considering the various types of current which extend over 5 digits, the internal voltage changes.

A conventional power supply voltage generating unit will be described with reference to FIGS. 1 and 2.

FIG. 1 shows the circuit structure of the power supply voltage generating unit for generating a negative voltage. The power supply voltage generating unit 10 is composed of a charge pump circuit CP, an oscillator OSC, a charge pump regulator Ha, an N-channel output transistor NH1, and a regulator H. The charge pump circuit CP is connected with a $V_{BB}$ voltage. The oscillator OSC is connected with the charge pump circuit CP. The charge pump regulator Ha has a voltage detecting circuit (level detector) Ld. The N-channel output transistor NH1 has the drain and source connected with the $V_{BB}$ voltage and a $V_{NN}$ voltage, respectively. The regulator H compares the $V_{NN}$ voltage with a reference value $V_{REFN}$ and outputs the comparing result to the gate of the output transistor NH1. The $V_{BB}$ voltage is a negative voltage of a substrate (Sub) voltage. The $V_{NN}$ voltage is a negative voltage which is connected with a circuit group (not shown) and is used in the operation of the circuit group. The $V_{BB}$ voltage and the $V_{NN}$ voltage are in the relation of $V_{BB} < V_{NN}$.

When the circuit group connected with the side of $V_{NN}$ voltage operates, noise is generated so that the $V_{NN}$ voltage sometimes changes. For example, the noise contained on the side of $V_{NN}$ voltage has the amplitude of hundreds of mV. A load capacitance of thousands of pF is added to the side of $V_{NN}$ voltage and a load capacitance of hundreds of thousands of pF is added to the side of $V_{BB}$ voltage.

The operation of power supply voltage generating unit 10 will be described with reference to FIG. 2.

First, as shown in waveform A, the $V_{NN}$ voltage increases when the circuit group operates to introduce the noise. When a determination time $t_{DET1}$ passes after the $V_{NN}$ voltage to start to increase, the regulator H operates as shown in waveform A as "regulator act" to output a high level signal of Vcc as an output signal H3 as shown in FIG. 42C.

When the H3 signal of the high level is supplied to the gate of the output transistor NH1, the output transistor NH1 is set to a conductive state. As a result, current flows from the side of $V_{NN}$ voltage to the side of $V_{BB}$ voltage to increase the $V_{BB}$ voltage as shown in waveform B. The noise on the side of $V_{BB}$ voltage, i.e., the $V_{BB}$ voltage noise shown in waveform B has the amplitude of tens of mV. While the output transistor NH1 is turned on, the current flows from the side of $V_{NN}$ voltage to the side of $V_{BB}$ voltage. Therefore, the noise contained on the side of $V_{NN}$ voltage decreases, and finally, the $V_{NN}$ voltage decreases and returns to the original level, as shown in waveform A.

The H3 signal goes to a low level of the $V_{BB}$ voltage to turn off the output transistor NH1, when the noise contained on the side of $V_{NN}$ voltage decreases so that the $V_{NN}$ voltage decreases lower than a predetermined voltage, as shown in waveform C. At this time, the $V_{NN}$ voltage is in a stable state as shown in waveform A. In this case, the side of $V_{BB}$ voltage is in the state in which the $V_{BB}$ voltage noise is contained. After a time $t_{DET2}$ passes after the output transistor NH1 is turned on and the noise flows to the side of $V_{BB}$ voltage, as shown in waveform C, the output signal Hi of the level detector Ld becomes high level, as shown in waveform D. When the signal H1 becomes high level, the operation of the oscillator OSC is started, as shown in waveform E.

The charge pump circuit CP operates in response to the output signal H2 from the oscillator OSC (charge pump act shown in waveform E), the charge pump circuit CP removes the $V_{BB}$ voltage noise to decrease the $V_{BB}$ voltage, as shown in waveform B. When the $V_{BB}$ voltage falls lower than a preset voltage, the output signal H1 of the level detector Ld becomes the low level, as shown in waveform B. As a result, the operation of the oscillator OSC and the operation of the charge pump circuit CP are stopped as shown in waveform E.

By the way, when noise is contained on the side of $V_{BB}$ voltage and the $V_{BB}$ voltage as a substrate voltage changes from a predetermined value, the threshold voltage Vt of the transistor formed on the substrate changes so that the margin sometimes reduces. Therefore, it is desirable that a quantity of the $V_{BB}$ voltage noise transferred when the output transistor NH1 is set to the conductive state is small. Also, it is desirable that an attenuation time td is short from when the noise moves from the side of $V_{NN}$ voltage to the side of $V_{BB}$ voltage to when the $V_{BB}$ voltage noise is eliminated, as shown in waveform B.

In above-mentioned structure, the $V_{BB}$ voltage noise starts to be removed after the noise is contained on the side of $V_{NN}$ voltage and then the determination time $t_{DET1}$ and the detection time $t_{DET2}$ of the level detector Ld have elapsed. Here, the determination time $t_{DET1}$ is 10 nsec, and the detection time $t_{DET2}$ is 1 µsec, for example.

Also, when the $V_{BB}$ voltage level is near the $V_{NN}$ voltage, the level change on the side of $V_{BB}$ voltage becomes late so that the noise produced on the side of $V_{NN}$ voltage does not attenuate immediately. This is because the operation of the charge pump circuit CP is started after the change of the voltage level on the side of $V_{BB}$ voltage, when the noise is generated on the side of $V_{NN}$ voltage.

FIG. 3 shows the circuit structure of the power supply voltage generating unit for generating a boosted voltage. In the power supply voltage generating unit 10A, a charge pump circuit CP is connected with a $V_{PP}$ voltage. The $V_{PP}$ voltage is a positive boosted voltage. A $V_{CH}$ voltage is the boosted voltage connected with a circuit group (not shown) and used for the operation of the circuit group. The $V_{PP}$ voltage and the $V_{CH}$ voltage are in the relation of $V_{PP} > V_{CH}$.

The power supply voltage generating unit 10A is the same in structure as the power supply voltage generating unit 10 shown in FIG. 1, and different from that in polarity. As shown in FIG. 4, the operation of the power supply voltage generating unit 10A is substantially the same as that of the power supply voltage generating unit 10. The charge pump circuit CP operates to recover the $V_{PP}$ voltage to the original boosted voltage, when the noise generated on the side of $V_{CH}$ decreases $V_{PP}$ voltage to a predetermined value or below through a P-channel output transistor PG1.

SUMMARY OF THE INVENTION

Therefore, an object of the present invention is to provide a semiconductor device with a short decay or attenuation time of noise.

Another object of the present invention is to provide a semiconductor device in which noise is small.

Still another object of the present invention is to provide a semiconductor device in which noise generated on the first voltage side is not almost propagated to the second voltage.

Yet still another object of the present invention provides a semiconductor device in which a power supply voltage can be recovered to an original level at a short time, even if the first voltage level is near the second voltage level.

In order to achieve an aspect of the present invention, a semiconductor device includes a voltage generating section operatively connected with a first voltage line portion and a second voltage line portion; a first voltage detecting section which detects a voltage of the first voltage line portion; a second voltage detecting section which detects a voltage of the second voltage line portion; and a control unit which controls the voltage generating section based on the detecting results of the first and second voltage detecting sections such that the first voltage line portion and the second voltage line portion are respectively set to a first voltage and a second voltage.

Here, the semiconductor device may further include a switch section provided between the first voltage line portion and the second voltage line portion, wherein the switch section selectively disconnects the second voltage line portion from the first voltage line portion based on the detection result of the second voltage detecting section.

In this case, the switch section operates to prevent the second voltage line portion voltage from changing from a second voltage due to the voltage generating section when the second voltage line portion voltage is set to the second voltage.

Also, the voltage generating section may generate the negative first voltage, and the second voltage is higher than the first voltage. Alternately, the voltage generating section may generate a boosted voltage, and the second voltage is lower than the first voltage.

Also, the semiconductor device may further include a connecting section provided between the output terminal the voltage generating section and the switch section to connect the first voltage line portion and the second voltage line portion.

Also, the semiconductor device may further include an auxiliary switch section provided between the voltage generating section and the first voltage line portion, to selectively disconnect the output terminal from the first voltage line portion based on the detection result of the first voltage detecting section. In this case, the auxiliary switch section operates to prevent the voltage of the first voltage line portion from changing due to the voltage of the second voltage line portion when the voltage of the second voltage line portion is different from the second voltage.

Also, the control unit controls the voltage generating section to operate when at least one of the first voltage line portion and the second voltage line portion is different from a corresponding one of the first voltage and the second voltage.

In order to achieve another aspect of the present invention, a semiconductor device includes a voltage generating section connected at an output terminal with first and second voltage line portions; and a control unit which controls the voltage generating section such that the first voltage line portion and the second voltage line portion are respectively set to a first voltage and a second voltage. When one of the first voltage line portion and the second voltage line portion is different from a corresponding one of the first voltage and the second voltage, the control unit controls the voltage generating section to generate a voltage directly to the one of the first voltage line portion and the second voltage line portion without passing through the other of the first voltage line portion and the second voltage line portion.

Also, the control unit controls the voltage generating section to operate when at least one of the first voltage line portion and the second voltage line portion is different from a corresponding one of the first voltage and the second voltage.

In order to achieve still another aspect of the present invention, a semiconductor device includes a voltage generating section connected at an output terminal with a first voltage line portion and a second voltage line portion and outputting a voltage from the output terminal in response to a control signal; a first voltage detecting section which outputs a first detection signal when the voltage of the first voltage line portion is different from the first voltage; a second voltage detecting section which outputs a second detection signal the voltage of the second voltage line portion is different from the second voltage; a control signal outputting section which outputs the control signal to the voltage generating section in response to at least one of the first detection signal and the second detection signal.

Also, the semiconductor device may further includes a wiring line which connects the first voltage line portion and the second voltage line portion; a MOS transistor provided between a node connected to the wiring line and the second voltage line portion, to connect the node and the second voltage line portion in response to an operation signal; and an operation signal generating section which generates the operation signal based on the second detection signal.

Also, the semiconductor device may further include a first MOS transistor provided to connect the output terminal of the voltage generating section to the first voltage line portion in response to a first operation signal; a second MOS transistor provided to connect the output terminal of the voltage generating section and the second voltage line portion in response to a second operation signal; a first operation signal generating section which generates the first operation signal based on the first detection signal; and a second operation signal generating section which generates the second operation signal based on the second detection signal.

BRIEF DESCRIPTION OF THE DRAWINGS

FIGS. 27A to 27D are timing charts showing signal waveforms at nodes of the level converter of FIG. 26;

FIG. 28 is a circuit block diagram showing the structure of the power supply voltage generating unit for generating a boosted voltage according to a fourth embodiment of the present invention;

FIG. 29 is a circuit block diagram showing the structure of a level converter of the power supply voltage generating unit in the fourth embodiment;

FIGS. 30A to 30D are timing charts showing signal waveforms at nodes of the level converter of FIG. 29;

FIGS. 36A to 36D are timing charts showing signal waveforms at nodes of the second level converter of FIG. 35;

FIG. 37 is the circuit block diagram showing the structure of the power supply voltage generating unit for generating a boosted voltage according to a sixth embodiment of the present invention;

FIGS. 42A to 42D are timing charts showing signal waveforms at nodes of the second level converter of FIG. 41;

DESCRIPTION OF THE PREFERRED EMBODIMENTS

Hereinafter, a semiconductor device of the present invention will be described with reference to the attached drawings.

Figure 1:
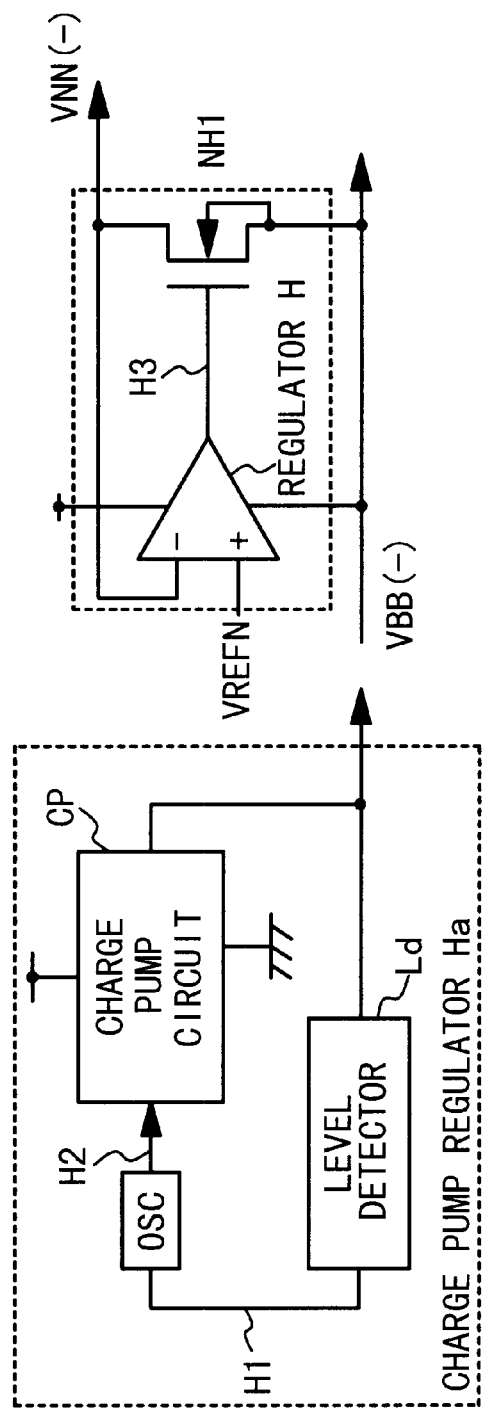
FIG. 1 is a circuit block diagram showing the structure of a first conventional power supply voltage generating unit which generates a negative voltage.
Figures 2A, 2B, 2C, 2D, 2E:
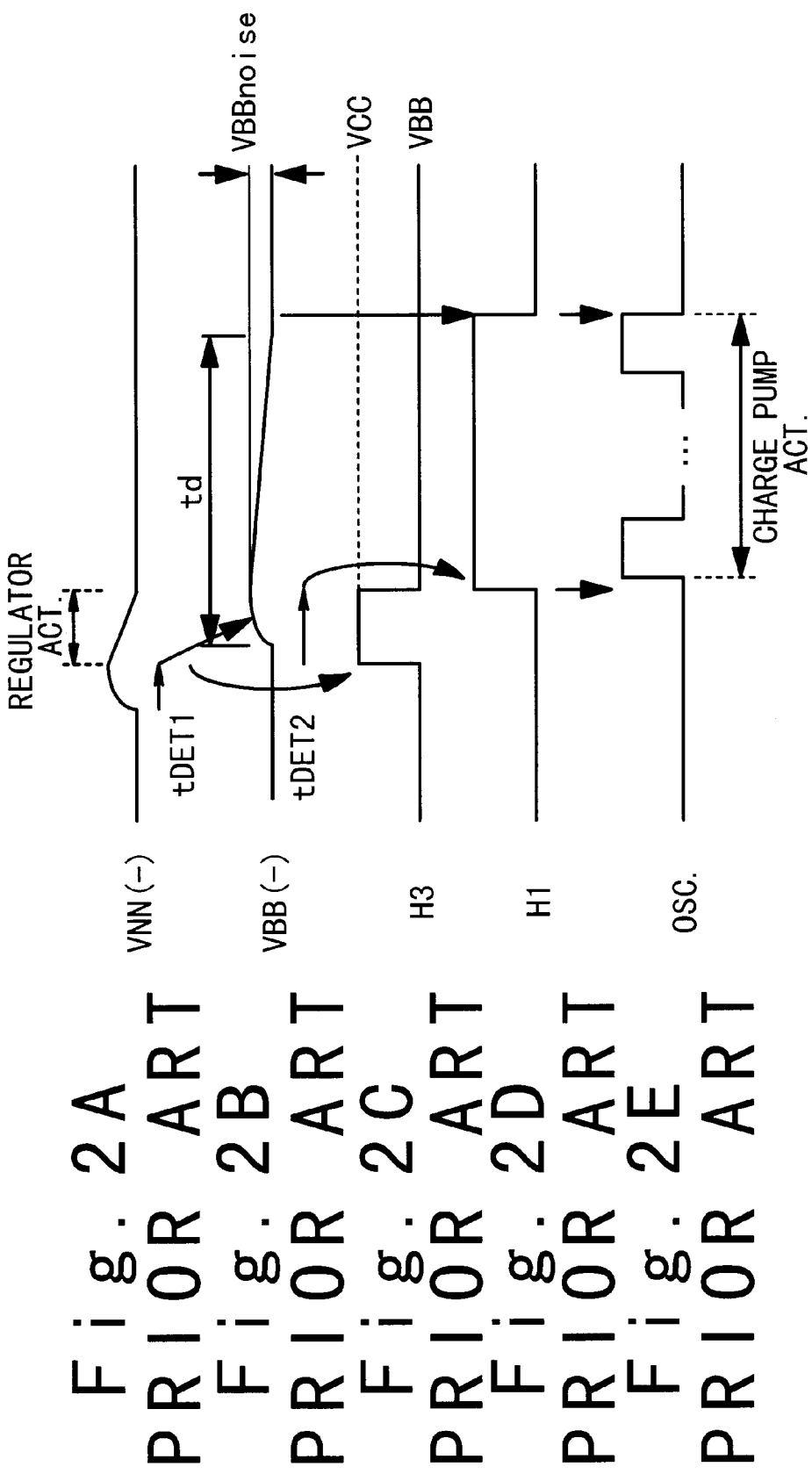
FIG. 2 is a timing chart showing the operation of the first conventional power supply voltage generating unit of FIG. 1.
Figure 3:
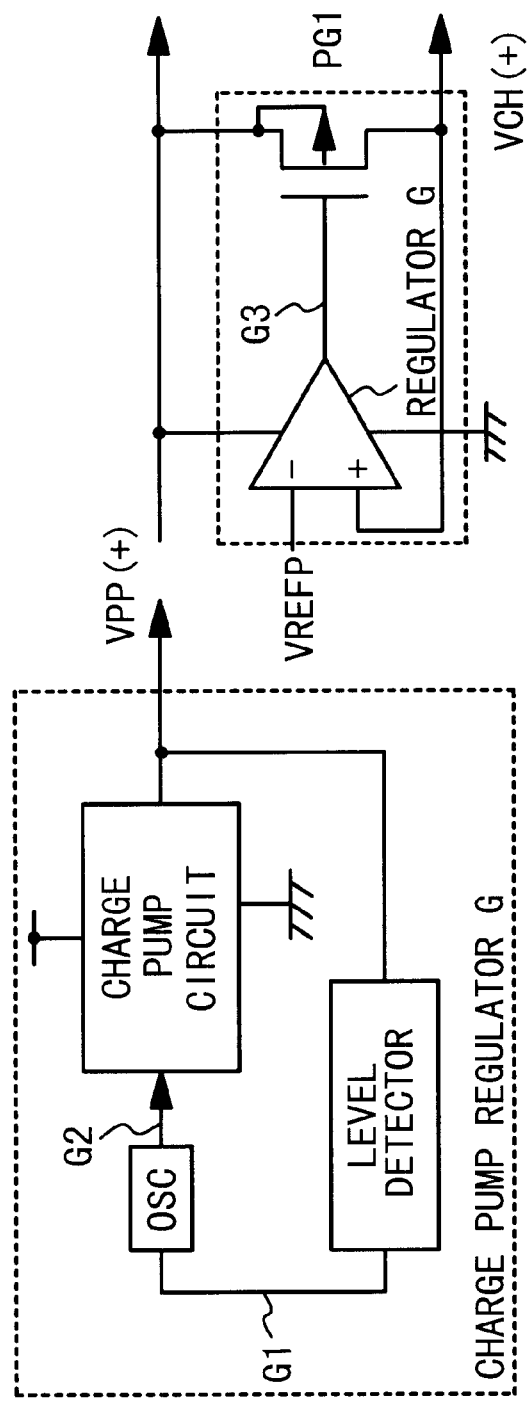
FIG. 3 is a circuit block diagram showing the structure of a second conventional power supply voltage generating unit which generates a boosted voltage.
Figure 4:
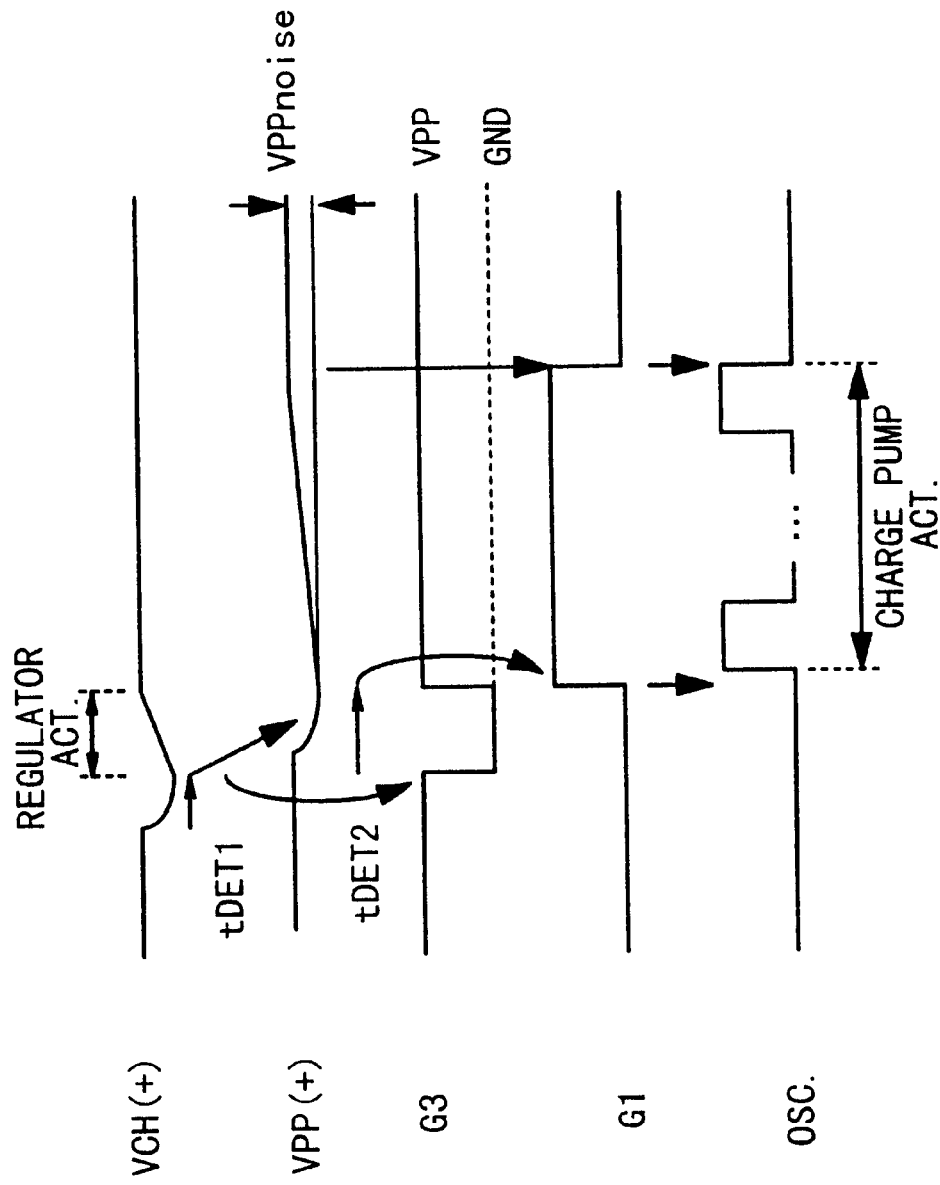
FIG. 4 is a timing chart showing the operation of the second conventional power supply voltage generating unit shown in FIG. 3.
Figure 5:
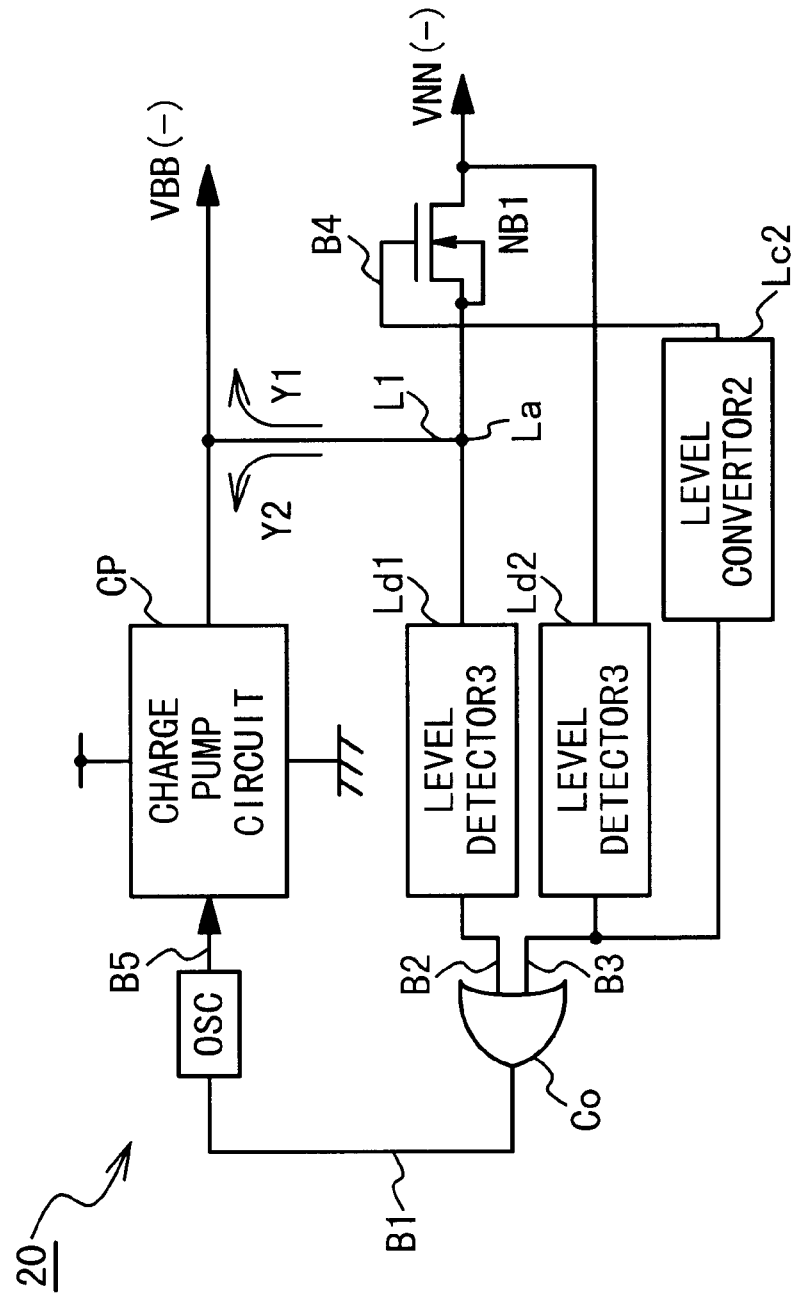
FIG. 5 is a circuit block diagram showing the structure of a power supply voltage generating unit for generating a negative voltage according to a first embodiment of the present invention.

FIG. 5 shows the circuit structure of the power supply voltage generating unit 20 according to the first embodiment of the present invention. The power supply voltage generating unit 20 generates a negative voltage.

Referring to FIG. 5, the power supply voltage generating unit 20 is composed of a charge pump circuit CP, an oscillator OSC, an OR circuit Co, two level detectors Ld1 and Ld2, a level converter Lc2, and an N-channel output transistor NB1. A $V_{BB}$ voltage is a negative voltage (a substrate voltage) which is used as a substrate bias for memory cell transistors. A $V_{NN}$ voltage is a word line voltage for the memory cell transistor and is a negative voltage. The $V_{BB}$ voltage and the $V_{NN}$ voltage are in the relation of $V_{BB} < V_{NN}$.

The charge pump circuit CP is directly connected with the $V_{BB}$ voltage and is connected with the $V_{NN}$ voltage through a wiring line L1. The charge pump circuit CP operates in response to an output signal B5 from the oscillator OSC. The charge pump circuit CP functions to absorb current from the side of $V_{BB}$ voltage and/or the side of $V_{NN}$ voltage and to decrease the $V_{BB}$ voltage and/or the $V_{NN}$ voltage.

The N-channel output transistor NB1 is connected with the side of $V_{NN}$ voltage to disconnect the $V_{NN}$ voltage from the $V_{BB}$ voltage. The output transistor NB1 has the source connected with the $V_{NN}$ voltage and the drain connected with the $V_{BB}$ voltage at the node La on the wiring line L1 on the side of $V_{NN}$ voltage.

The level detector Ld1 detects the $V_{BB}$ voltage. When the $V_{BB}$ voltage is higher than a predetermined value, the level detector Ld1 outputs the signal of the high level as an output signal B2. The level detector Ld2 detects the $V_{NN}$ voltage. When the $V_{NN}$ voltage is higher than the predetermined value, the level detector Ld1 outputs the signal of a high level as an output signal B3.

The OR circuit Co outputs a signal of the high level as an output signal B1 when at least one of the output signals B2 and B3 is in the high level. The oscillator OSC outputs an output signal B5 to the charge pump circuit CP in response to the output signal B1 of the high level.

The level converter Lc2 receives the output signal B3 from the level detector Ld2 and converts the output signal B3 in level into an output signal B4 to output to the gate of the output transistor NB1.

Next, the operation of power supply voltage generating unit 20 will be described with reference to FIG. 6. Hereinafter, three cases, i.e., case (1) where noise is generated on the side of $V_{NN}$ voltage, case (2) where noise is generated on the side of $V_{BB}$ voltage, and case (3) where noise is generated in both of the side of $V_{NN}$ voltage and the side of $V_{BB}$ voltage, will be described. It should be noted that a $V_{NNst}$ voltage shows a voltage set for the $V_{NN}$ voltage in the stable state in which noise is not contained in the $V_{NN}$ voltage in waveform A. Also, in waveform B, a $V_{BBst}$ voltage shows a voltage set for the $V_{BB}$ voltage in the stable state in which noise is not contained to the $V_{BB}$ voltage.

First, the case (1) where the noise is generated on the side of $V_{NN}$ voltage will be described.

When the noise from a circuit group is contained on the side of $V_{NN}$ voltage, the $V_{NN}$ voltage increases, as shown in waveform A. At this time, the level detector Ld2 outputs the high signal as the output signal B3 after a predetermined time $t_{DET1}$, as shown in waveform C. The output signal B4 is generated from the output signal B3 of the high level by the level converter Lc2 and is supplied to the gate of the output transistor NB1, so that the output transistor NB1 is set to the conductive state. Then, the noise contained on the side of $V_{NN}$ voltage is transferred to the side of $V_{BB}$ voltage through the output transistor NB1 and the wiring line L1, as shown by an arrow Y1 in FIG. 5 and by $V_{BBnoise}$ in FIG. 6, waveform B.

On the other hand, as mentioned above, when the output signal B3 of the high level is outputted from the level detector Ld2, the output signal B1 from the OR circuit Co becomes the high level as shown in waveform C. As a result, the oscillator OSC starts the operation, as shown in waveform D. Thus, the charge pump circuit CP operates and the noise contained on the side of $V_{NN}$ voltage is removed, as shown by an arrow Y2 in FIG. 5 and by $V_{BBnoise}$ in FIG. 6, waveform B.

As mentioned above, the noise is transferred from the side of $V_{NN}$ voltage to the side of $V_{BB}$ voltage as shown by the arrow Y1 once when the output transistor NB1 is set to the conductive state. In this case, the charge pump circuit CP absorbs the $V_{BB}$ voltage noise $V_{BBnoise}$ transferred as shown by the arrow Y1, in addition to the noise contained on the side of $V_{NN}$ voltage, as shown in the arrow Y2. The $V_{BB}$ voltage noise is the noise moved from the side of $V_{NN}$ voltage to the side of $V_{BB}$ voltage for a short time from the time of the setting to the conductive state of the output transistor NB1 to the operation start of the charge pump circuit CP. Therefore, a quantity of the $V_{BB}$ voltage noise generated on the side of $V_{BB}$ voltage when the output transistor NB1 is set to the conductive state is suppressed to a small level, unlike the conventional example.

As mentioned above, in the power supply voltage generating unit 20, the noise contained on the side of $V_{NN}$ voltage is reduced in the directions shown by both of the arrows Y1 and Y2. Therefore, the noise can be quickly removed from the side of $V_{NN}$ voltage.

Also, in the conventional example, the noise generated on the side of $V_{NN}$ voltage is removed as the $V_{BB}$ voltage noise after the times $t_{DET1}$ and $t_{DET2}$ from the generation of the noise. On the other hand, both of the removal of the noise contained on the side of $V_{NN}$ voltage and the removal of the $V_{BB}$ voltage noise are started immediately after the time $t_{DET1}$ in the power supply voltage generating unit 20. In addition, in this case, as mentioned above, there is little quantity of the $V_{BB}$ voltage noise. Therefore, the decay time td of the $V_{BB}$ voltage noise is shorter, compared with the conventional example.

Next, the case (2) where the noise is generated on the side of $V_{BB}$ voltage will be described.

In this case, the output signal B1 from the OR circuit Co and the output signal B2 from the level detector Ld1 are set to the high level. Thus, the operation of the oscillator OSC is started. The charge pump circuit CP operates in response to the operation of the oscillator OSC to remove the noise which generated on the side of $V_{BB}$ voltage. In this case, the output signal B3 from the level detector Ld2 is in the low level so that the output transistor NB1 is not set to the conductive state. Therefore, the charge pump circuit CP never absorbs current from the side of $V_{NN}$ voltage with a higher voltage than the $V_{BB}$ voltage and the noise removal on the side of $V_{BB}$ voltage is carried out as it is.

Next, the case (3) where the noise is generated in both on the side of $V_{NN}$ voltage and the side of $V_{BB}$ voltage will be described. In this case, the output signals B2 and B3 from the level detectors Ld1 and Ld2 become high level so that the output signal B1 from the OR circuit Co becomes the high level. As a result, the charge pump circuit CP is operated by the oscillator OSC. The charge pump circuit CP removes the noise on the side of $V_{BB}$ voltage and the noise on the side of $V_{NN}$ voltage through the wiring line L1.

The following effects can be attained according to the power supply voltage generating unit 20.

The noise to the $V_{BB}$ voltage becomes small when the $V_{NN}$ voltage increases. Also, even when the level of the $V_{BB}$ voltage is near the level of the $V_{NN}$ voltage, the time necessary to recover the changed power supply voltage to the original level can be made short. The above effects are attained because it is possible to reduce the influence of the power supply noise by operating the charge pump circuit CP when the $V_{BB}$ voltage or the $V_{NN}$ voltage increases.

FIGS. 7 to 13 and 14A and 14B show the circuit structures and operations of each of the components of the power supply voltage generating unit 20.

Figure 7:
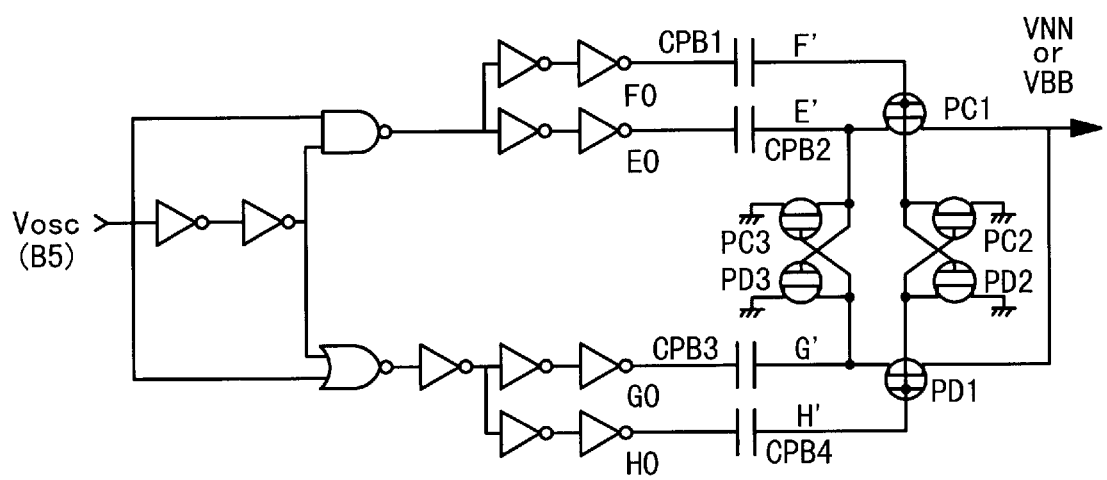
FIG. 7 is a circuit block diagram showing the internal structure of a charge pump circuit of the power supply voltage generating unit in the first embodiment.
Figure 8:
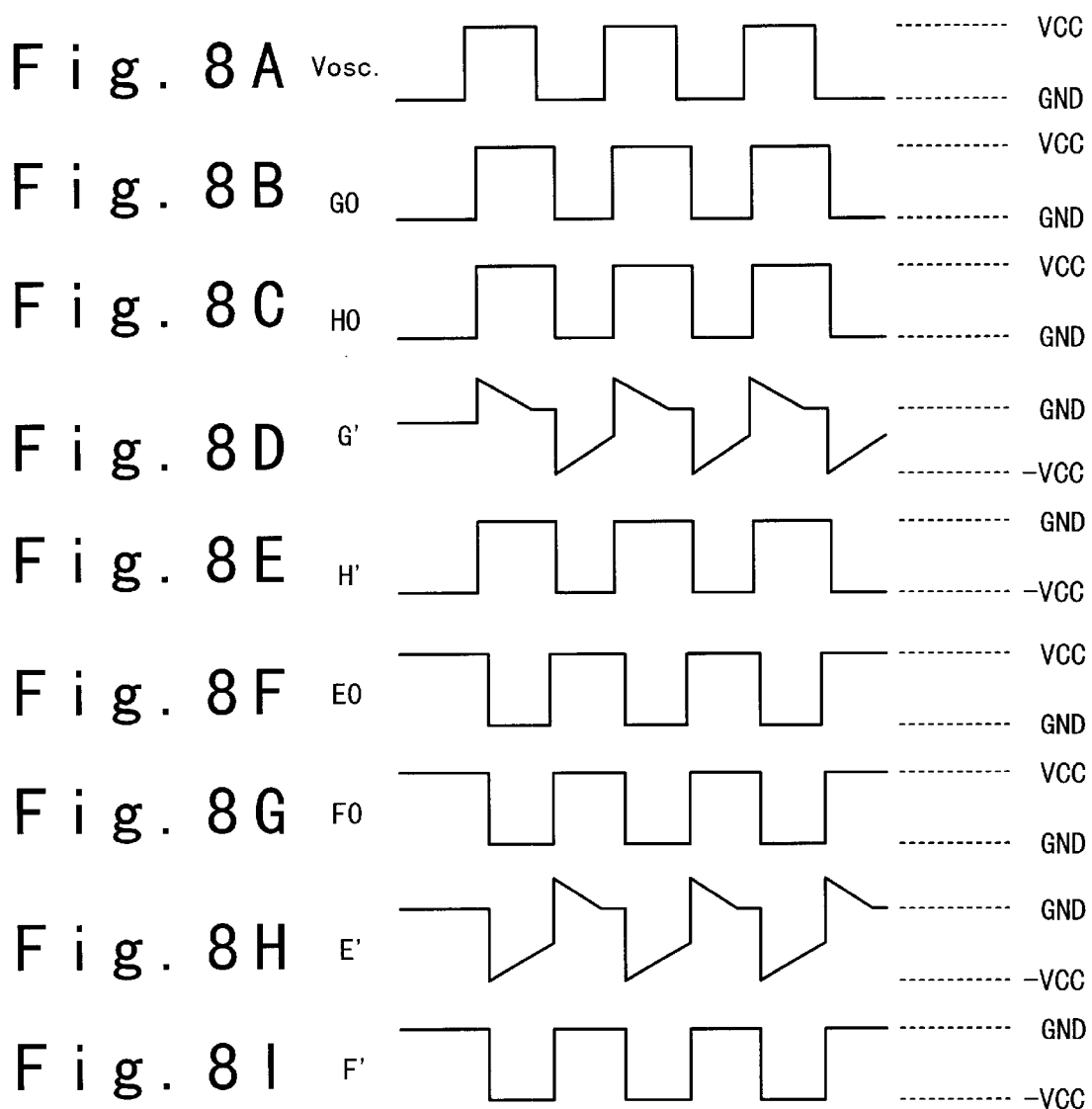
FIGS. 8A to 8I are timing charts showing signal waveforms at nodes of the charge pump circuit of FIG. 7.

The internal structure of the charge pump circuit CP is shown in FIG. 7. FIGS. 8A to 8I are timing charts showing signal waveforms at the nodes G0, H0, G', H', E0, F0, E', F' of FIG. 7. As shown in FIG. 7, the charge pump circuit CP receives the output signal B5 (FIG. 5) from the oscillator OSC as the $V_{osc}$ signal. The $V_{osc}$ signal is propagated from the left to the right in FIG. 7 in the circuit group composed of an inverter, a NAND circuit, a NOR circuit, capacitors CPB1, CPB2, CPB3, and CPB4, MOS transistors PC1, PC2, PC3, PD1, PD2, and PD3. As shown in FIGS. 8A to 8I, the voltage of each node takes either of VCC, GND and −VCC. In this way, the charge pump circuit CP operates to the $V_{NN}$ voltage and/or the $V_{BB}$ voltage as mentioned above.

Figure 9:
FIG. 9 is a circuit block diagram showing an OR circuit of the power supply voltage generating unit in the first embodiment.

FIG. 9 shows the OR circuit Co and the input signals B2 and B3 and the output signal B1 in FIG. 5 correspond to signals $V_{det1}$, $V_{det2}$ and $V_{det}$, respectively.

Figure 10:
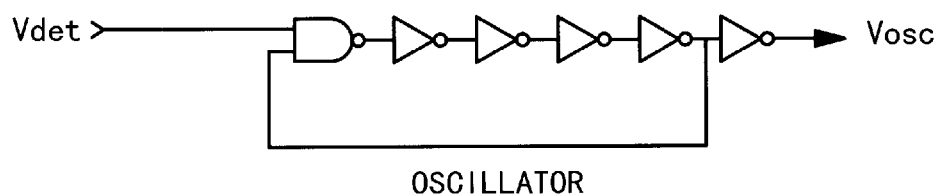
FIG. 10 is a circuit block diagram showing the structure of an oscillator of the power supply voltage generating unit in the first embodiment.

As shown in FIG. 10, the oscillator OSC is a ring oscillator and a NAND circuit and a plurality of inverters connected in series. The $V_{det}$ signal in FIG. 9 is received by one of the input terminals of the NAND circuit, and the signal outputted from one of the inverters is fed back to the other input terminal of the NAND circuit. The $V_{osc}$ signal outputted from the oscillator OSC is received by the charge pump circuit CP, as shown in FIG. 7.

Figure 11:
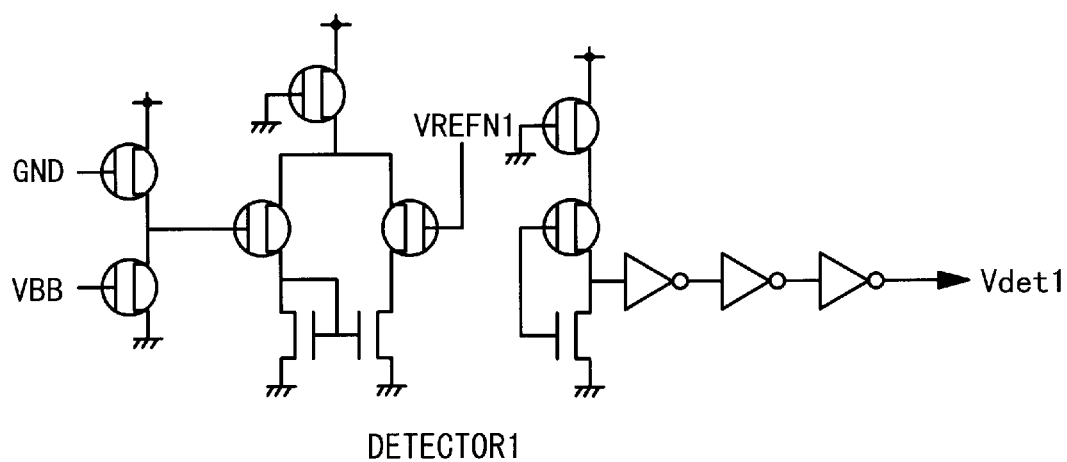
FIG. 11 is a circuit block diagram showing a first level detector of the power supply voltage generating unit in the first embodiment.
Figure 12:
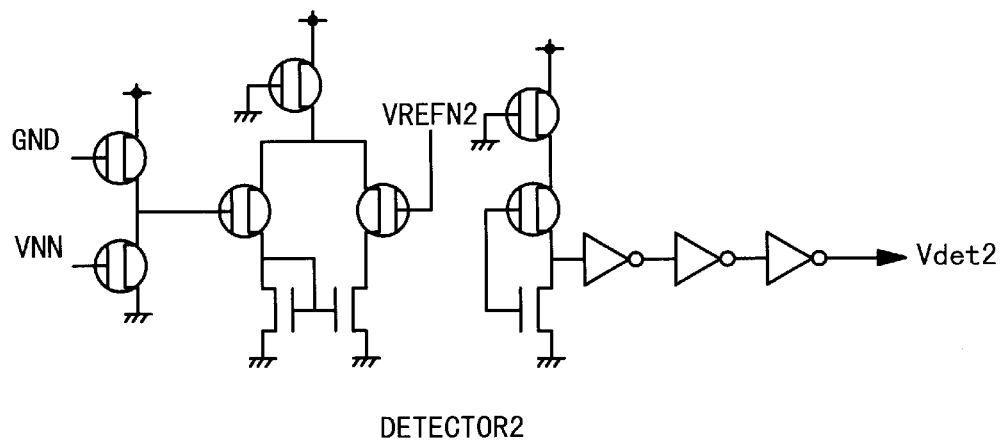
FIG. 12 is a circuit block diagram showing a second level detector of the power supply voltage generating unit in the first embodiment.

The circuit structure of the level detector Ld1 is shown in FIG. 11. The circuit structure of the level detector Ld2 is shown in FIG. 12. As shown in FIG. 11, one of the gates of two MOS transistors of an input stage is connected with ground (GND) and the other is connected with the $V_{BB}$ voltage, as shown in FIG. 11. As shown in FIG. 12, the level detector Ld2 has the same structure as the level detector Ld1. One of the gates of two MOS transistors of an input stage is connected with ground (GND) and the other is connected with the $V_{NN}$ voltage, as shown in FIG. 12. The reference voltages $V_{REFN1}$ and $V_{REFN2}$ are different from each other and used to detect the $V_{BB}$ voltage and the $V_{NN}$ voltage by the level detectors Ld1 and Ld2, as shown in FIG. 11 and FIG. 12.

Figure 13:
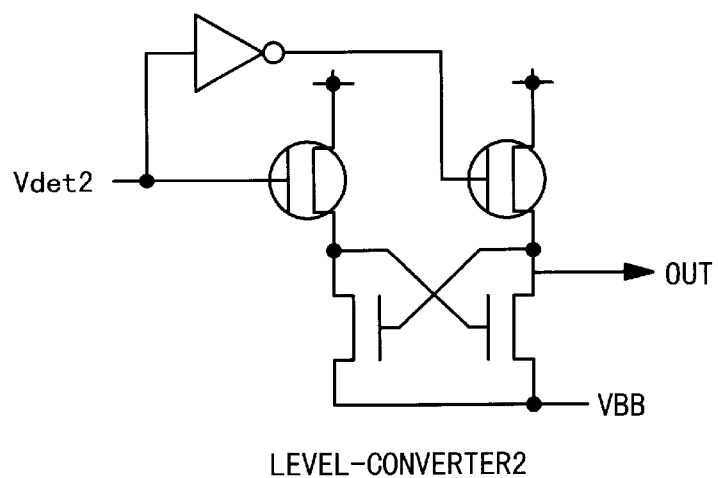
FIG. 13 is a circuit block diagram showing a level converter of the power supply voltage generating unit in the first embodiment.
Figure 14A:
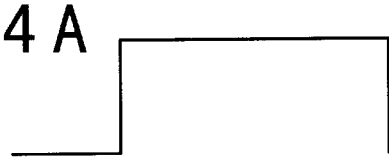
FIGS. 14A and 14B are timing charts showing the signal waveforms of an input signal and an output signal in the level converter of FIG. 13.
Figure 14B:
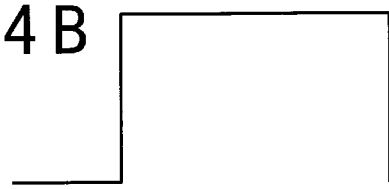

The circuit structure of the level converter Lc2 is shown in FIG. 13. FIGS. 14A and 14B are timing charts showing the input signal $V_{DET2}$ and the output signals OUT of the level converter Lc2. The input signal $V_{DET2}$ of the level converter Lc2 corresponds to the B3 signal of FIG. 5 and FIGS. 14A, and the output signal OUT in FIG. 13 and 14B corresponds to the B4 signal in FIG. 5. When the input signal $V_{DET2}$ is in the low level of the ground (GND) level, the level converter Lc2 outputs the signal of the $V_{BB}$ voltage as the output signal OUT, as shown in FIG. 13 and FIG. 14B. When the input signal Vdet2 is in the high level of the Vcc voltage level, the level converter Lc2 outputs the signal of the Vcc voltage just as it is, as output signal OUT.

In the first embodiment, the power supply voltage generating unit is described to generate a negative voltage. When a boosted voltage should be generated in place of the negative voltage, only the polarity is changed and the structure and operation are substantially the same as in the first embodiment. FIGS. 15 to FIG. 24 show the power supply voltage generating unit to generate the boosted voltage according to the second embodiment of the present invention.

Figure 15:
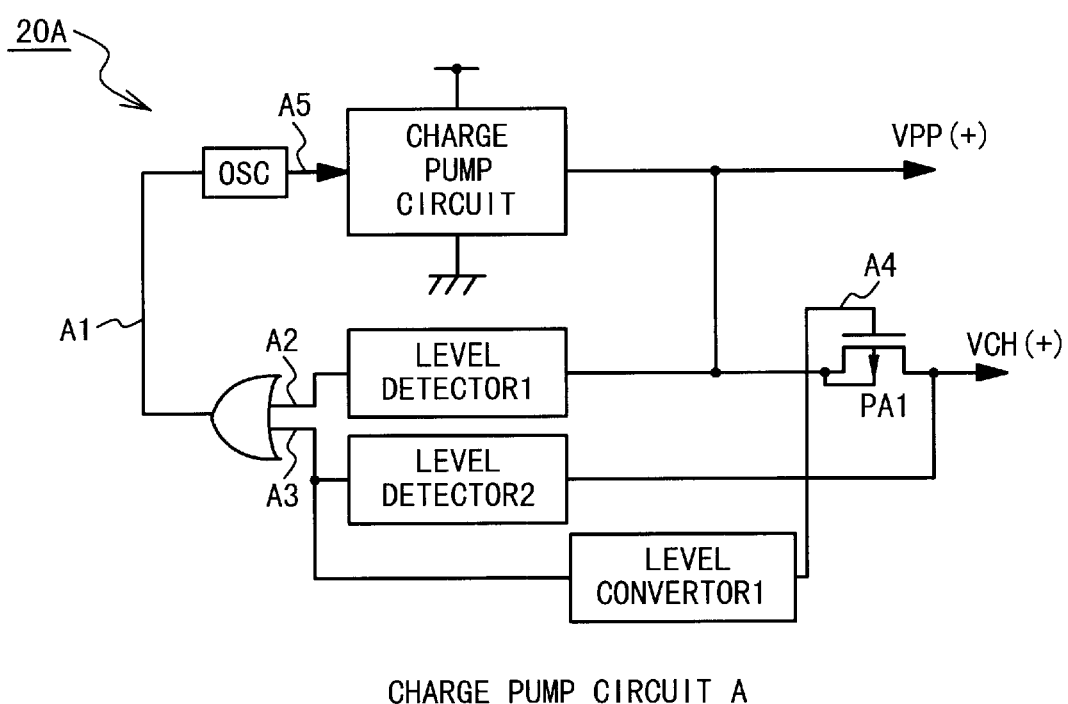
FIG. 15 is a circuit block diagram showing the structure of the power supply voltage generating unit for generating a boosted voltage according to a second embodiment of the present invention.
Figure 16:
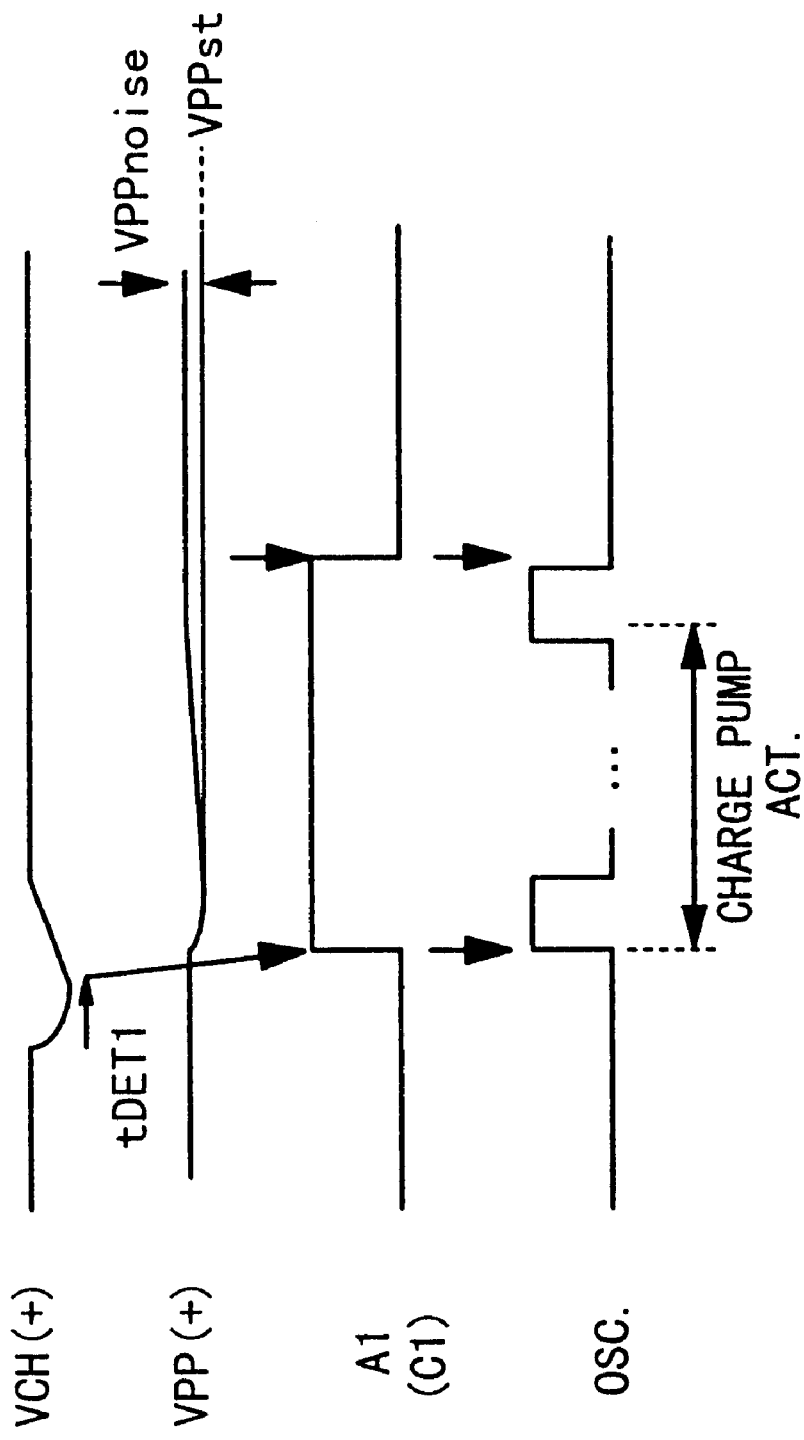
FIG. 16 is a timing chart showing the operation of the power supply voltage generating unit in the second embodiment.
Figure 17:
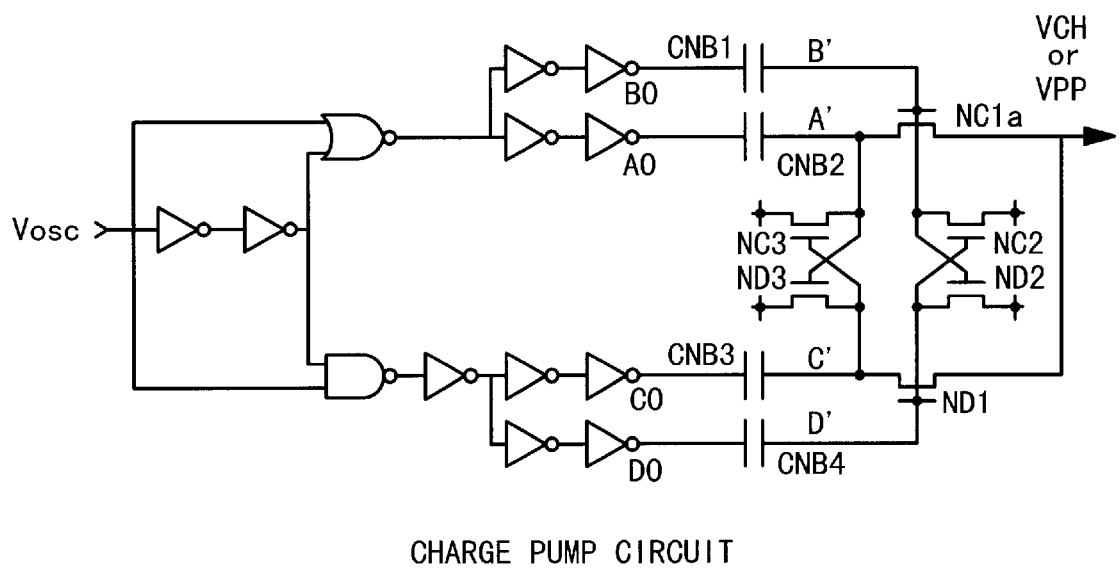
FIG. 17 is a circuit block diagram showing the internal structure of a charge pump circuit of the power supply voltage generating unit in the second embodiment.
Figure 18:
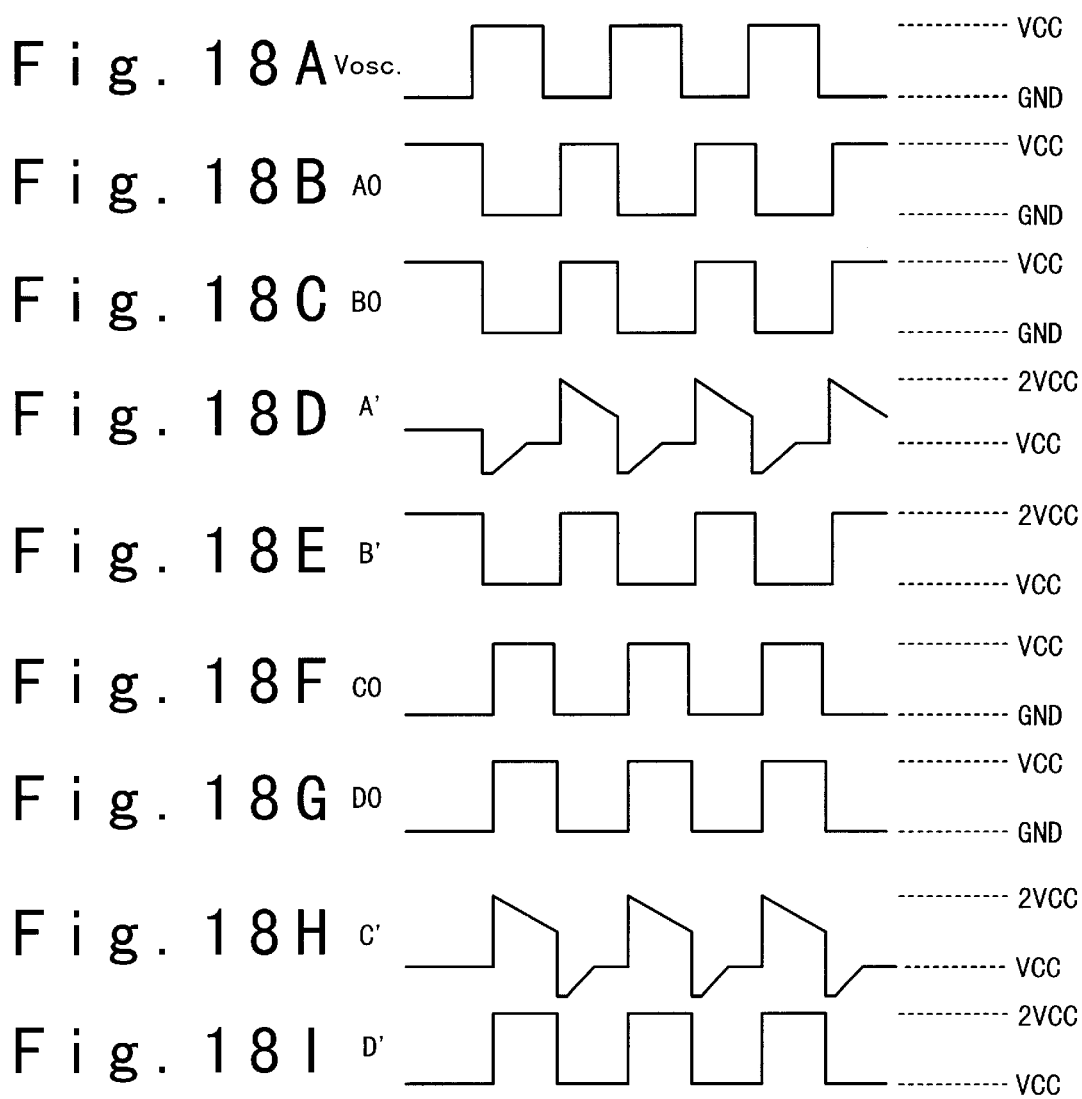
FIGS. 18A to 18I are timing charts showing signal waveforms at nodes of the charge pump circuit of FIG. 17.
Figure 19:
FIG. 19 is a circuit block diagram showing an OR circuit of the power supply voltage generating unit in the second embodiment.
Figure 20:
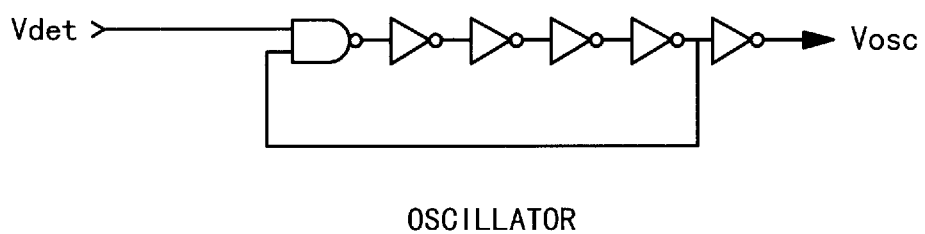
FIG. 20 is a circuit block diagram showing the structure of an oscillator of the power supply voltage generating unit in the second embodiment.
Figure 21:
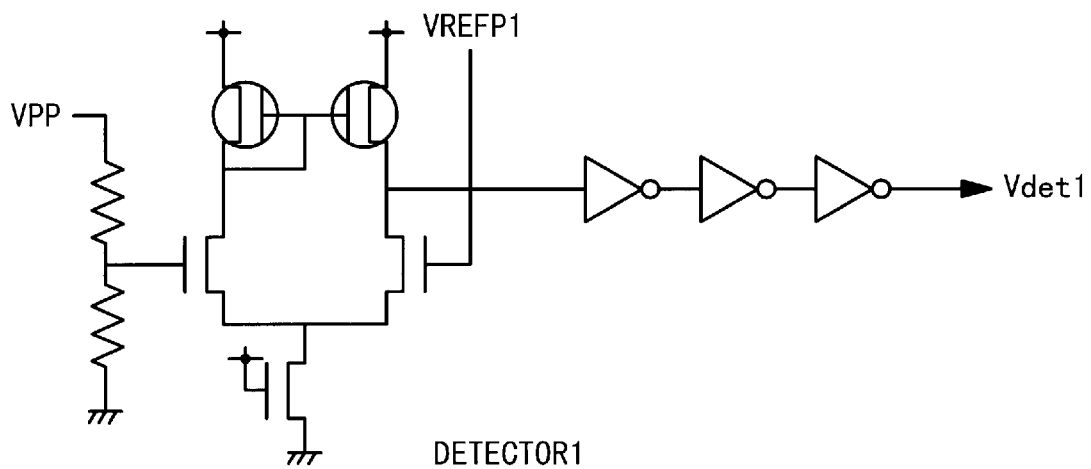
FIG. 21 is a circuit block diagram showing a first level detector of the power supply voltage generating unit in the second embodiment.
Figure 22:
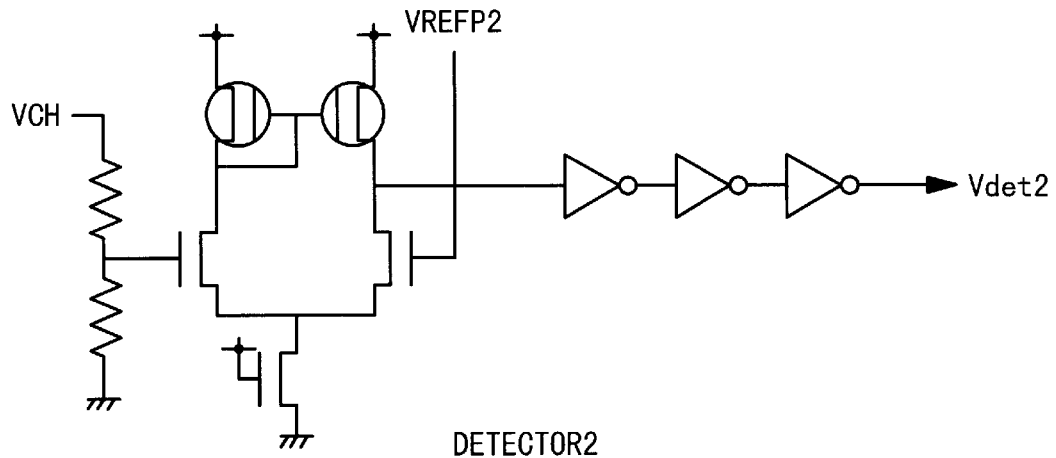
FIG. 22 is a circuit block diagram showing a second level detector of the power supply voltage generating unit in the second embodiment.
Figure 23:
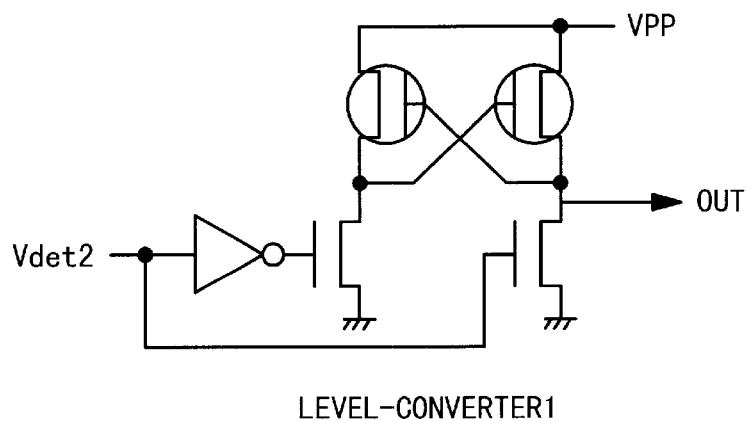
FIG. 23 is a circuit block diagram showing a level converter of the power supply voltage generating unit in the second embodiment.
Figure 24A:
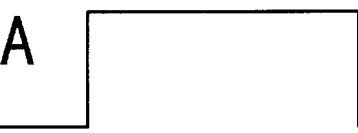
FIGS. 24A and 24B are timing charts showing the signal waveforms of an input signal and an output signal in the level converter of FIG. 23.
Figure 24B:

FIG. 5 showing the negative voltage generating unit 20 corresponds to FIG. 15 showing a boosted voltage generating unit 20A. FIG. 6 corresponds to FIG. 16. FIG. 7 corresponds to FIG. 17. Hereinafter, in the same way, FIGS. 8A to 8I correspond to FIGS. 18A to 18I, FIG. 9 corresponds to FIG. 19 and FIG. 10 corresponds to FIG. 20. FIG. 11 corresponds to FIG. 21, FIG. 12 corresponds to FIG. 22, FIG. 13 corresponds to FIG. 23 and FIGS. 14A and 14B correspond to FIGS. 24A and 24B, respectively. Because the boosted voltage generating unit 20A shown in FIGS. 15 to 24B is attained by only inverting in polarity the negative voltage generating unit 20 shown from FIG. 5 to FIG. 14B, the detailed description is omitted.

Next, the power supply voltage generating unit 30 according to the third embodiment of the present invention will be described with reference to FIG. 25.

The power supply voltage generating unit 30 generate a negative voltage. The power supply voltage generating unit 30 of FIG. 25 is basically the same as the power supply voltage generating unit 20 of FIG. 5 in the first embodiment. The power supply voltage generating unit 30 of FIG. 25 is different from the power supply voltage generating unit 20 of FIG. 5 in the first embodiment in the following points. That is, the output transistor NB1 of FIG. 5 is the N-channel transistor while an output transistor PD1 of FIG. 25 is a P channel transistor. Also, the internal structure of a level converter Lc4 is different. In FIG. 25, the same components as those of FIG. 5 are allocated with the same reference numerals or symbols, and has the same structures and operate in the same manner.

Figure 6:
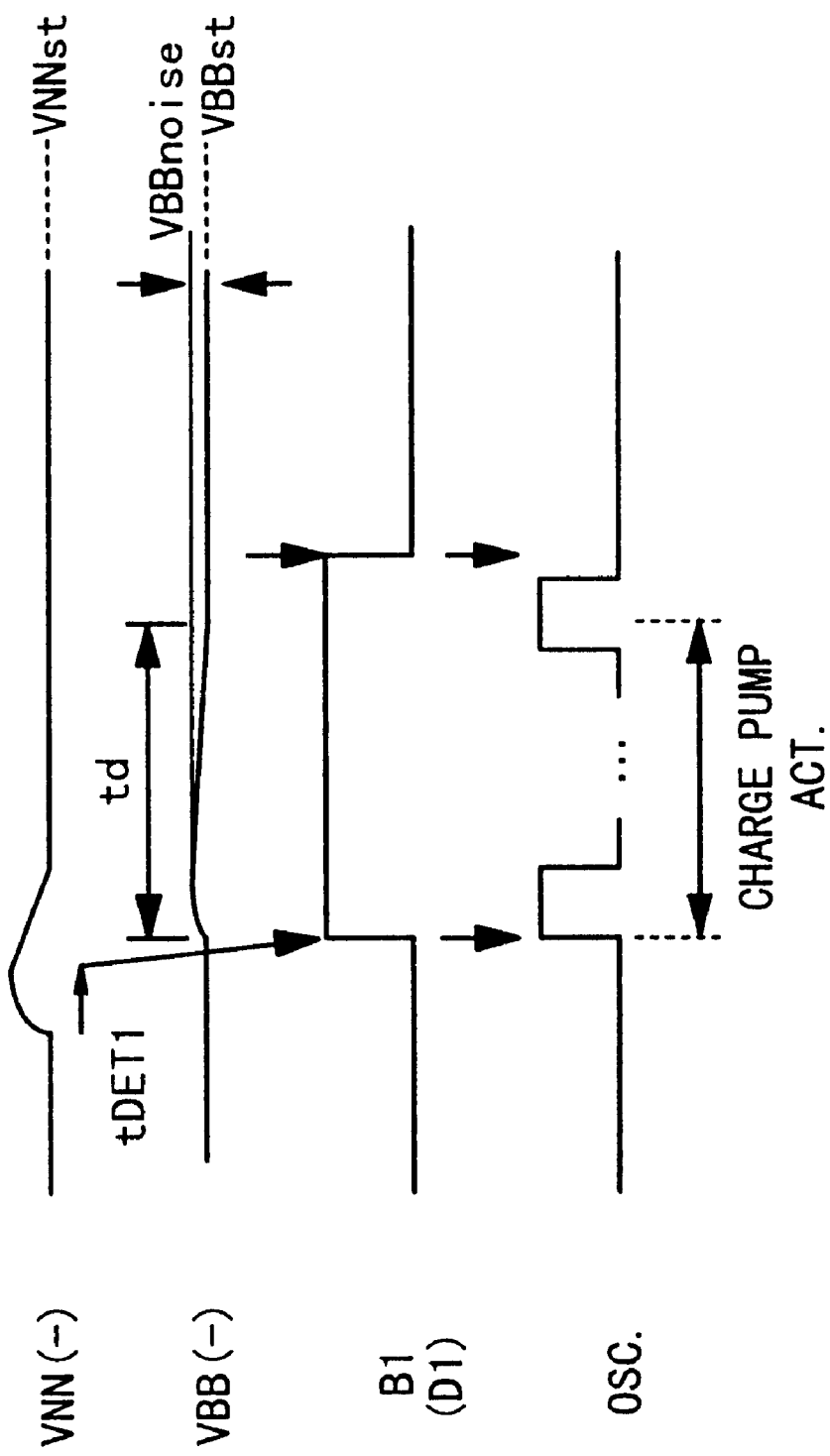
FIG. 6 is a timing chart showing the operation of the power supply voltage generating unit in the first embodiment.

The operation of the power supply voltage generating unit 30 is as shown in FIG. 6 and is substantially the same as that of the power supply voltage generating unit 20 of FIG. 5.

Figure 25:
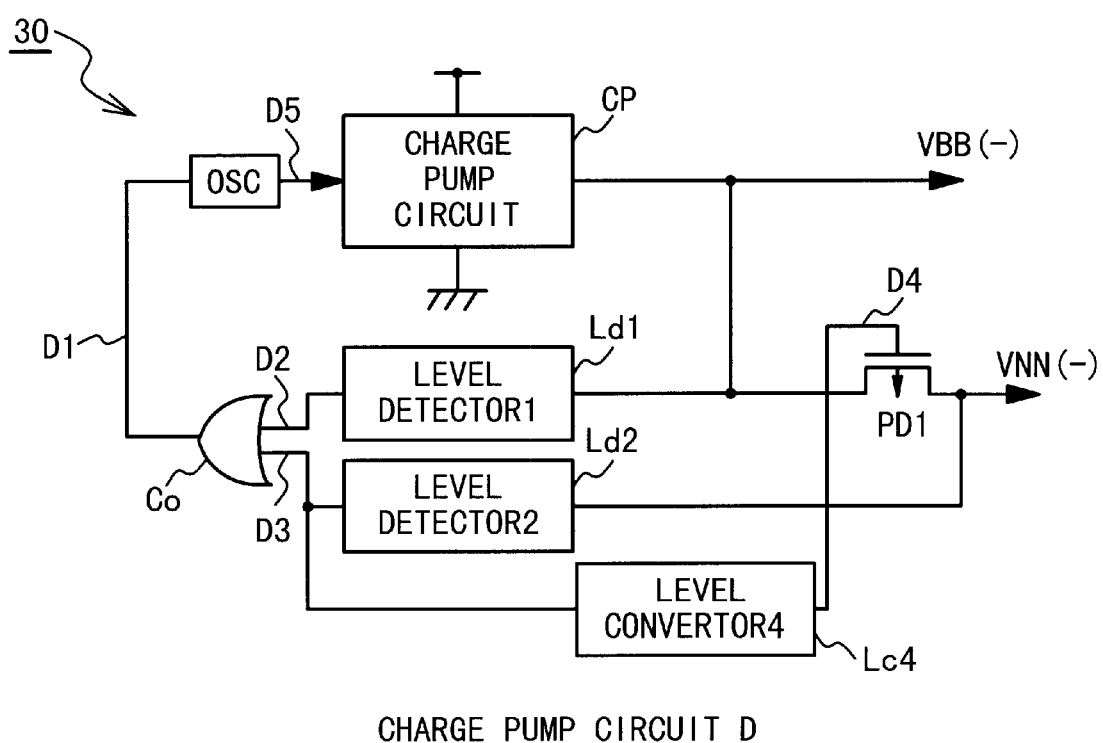
FIG. 25 is a circuit block diagram showing the structure of the power supply voltage generating unit for generating a negative voltage according to a third embodiment of the present invention.
Figure 26:
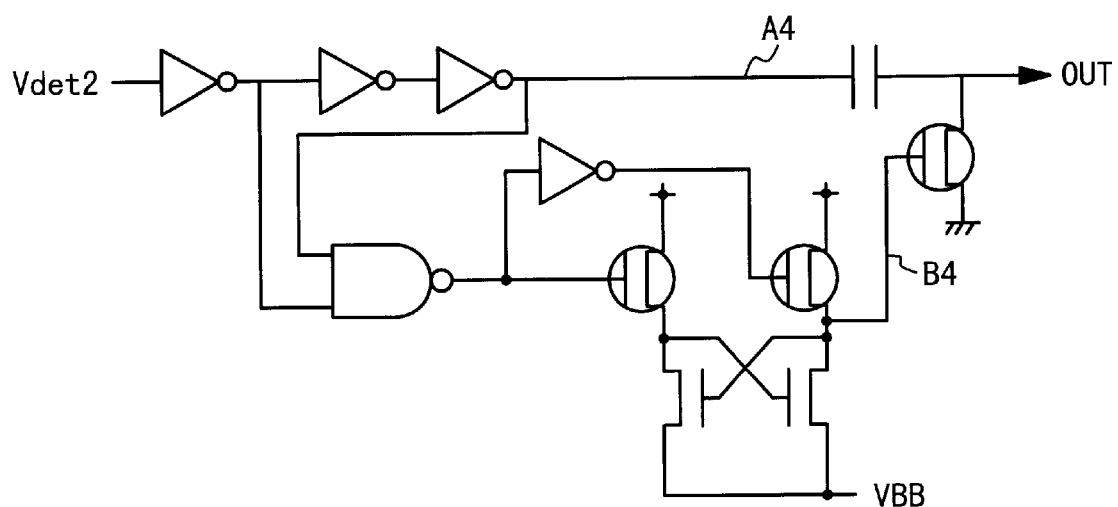
FIG. 26 is a circuit block diagram showing the structure of a level converter of the power supply voltage generating unit in the third embodiment.

The internal structure of the level converter Lc4 is shown in FIG. 26. FIGS. 27A to 27D are timing charts showing the signal waveforms of nodes A4 and B4 in the level converter Lc4. As shown in FIG. 26 and FIGS. 27A to 27D, it is supposed that the signal $V_{det2}$ as the signal D3 (FIG. 25) supplied from the level detector Ld2 is in the high level. In this case, the level converter Lc4 supplies the signal of low level (−Vcc) to the gate of the output transistor PD1 as the signal OUT of the output signal D4 to set the output transistor PD1 to the conductive state.

In the third embodiment, the power supply voltage generating unit 30 is described. When a boosted voltage should be generated in place of the negative voltage, only the polarity is changed and the structure and operation are substantially the same as in the third embodiment. FIGS. 28 to FIG. 30 show the power supply voltage generating unit to generate the boosted voltage according to the fourth embodiment of the present invention.

FIG. 25 showing the negative voltage generating unit 30 corresponds to FIG. 28 showing a boosted voltage generating unit 30A. FIG. 26 correspond to FIG. 29, and FIGS. 27A to 27D correspond to FIGS. 30A to 30D. The boosted voltage generating unit 30A shown in FIGS. 28 to 30 can be attained by only inverting in polarity the negative voltage generating unit 30 shown FIGS. 25 to 27D. Therefore, the detailed description is omitted.

Next, the power supply voltage generating unit 40 according to the fifth embodiment of the present invention will be described with reference to FIG. 31.

The power supply voltage generating unit 40 generate a negative voltage. The power supply voltage generating unit 40 of FIG. 31 is basically the same as the power supply voltage generating unit 30 of FIG. 25 in the third embodiment. The power supply voltage generating unit 40 of FIG. 31 is different from the power supply voltage generating unit 30 of FIG. 25 in the third embodiment in the following points. That is, a P-channel transistor PF2 is added on the side of $V_{BB}$ voltage to separate the $V_{BB}$ voltage and the $V_{NN}$ voltage and a level converter Lc4B is added to operate the P-channel transistor PF2. In addition, the internal structure of the level converter Lc4A is different.

Figure 31:
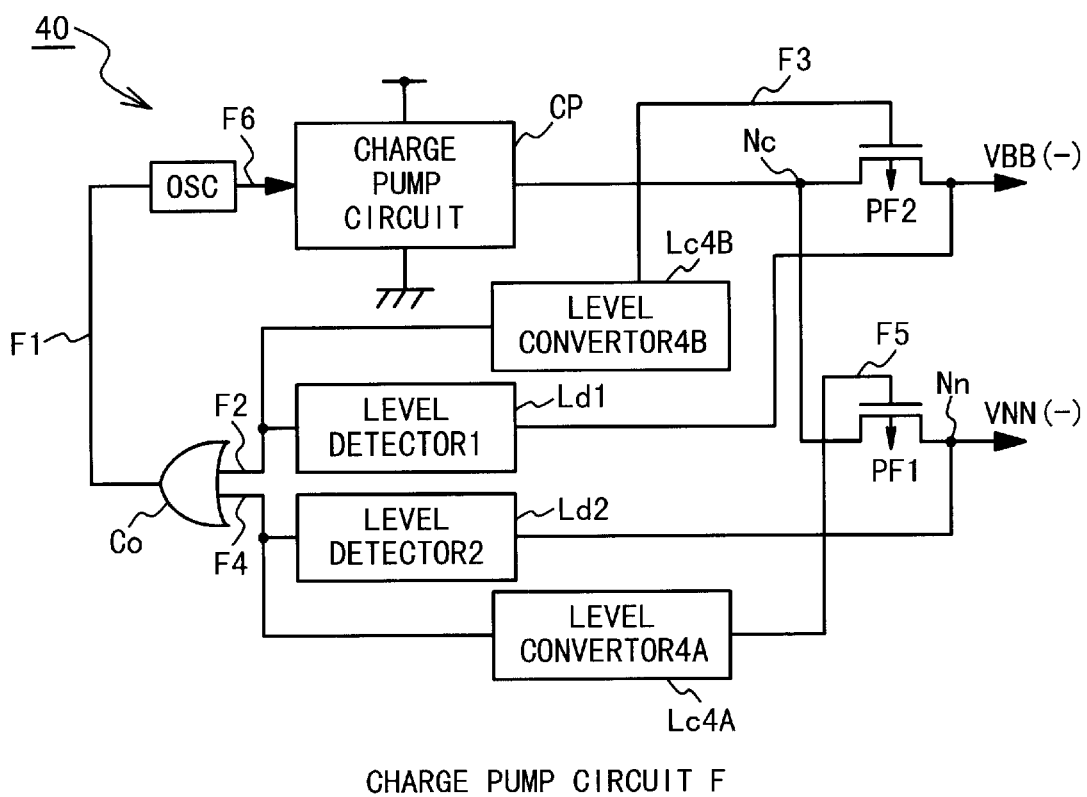
FIG. 31 is a circuit block diagram showing the structure of the power supply voltage generating unit for generating a negative voltage according to a fifth embodiment of the present invention.

In FIG. 31, the same components as those of FIG. 5 or 25 are allocated with the same reference numerals or symbols, and have the same structures and operate in the same manner.

Figure 32:
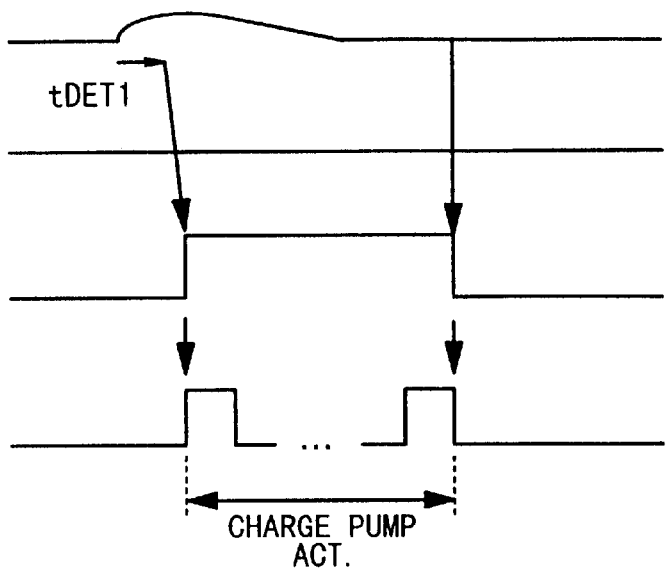
FIG. 32 is a timing chart showing the operation of the power supply voltage generating unit in the fifth embodiment.

The operation of the power supply voltage generating unit 40 is as shown in FIG. 32 and is different from that of the power supply voltage generating unit in the first or third embodiment.

When the power supply voltage generating unit 40 is applied, the substrate (Sub) voltage of the transistors PF1 and PF2 is set to the $V_{NN}$ voltage, ground (GND) voltage or the VINT voltage, as shown in FIG. 31.

In the power supply voltage generating unit 40, the output transistor PF2 is provided on the side of $V_{BB}$ voltage to separate the $V_{BB}$ voltage level and the $V_{NN}$ voltage level. The output transistor PF2 has the source connected with the output terminal of the charge pump circuit CP and the drain connected with the side of the $V_{BB}$ voltage (the side of a noise generating source on the side of $V_{BB}$ voltage). The gate of the output transistor PF2 is connected with the output terminal of the level converter Lc4B. The level converter Lc4B receives the output signal F2 from the level detector Ld1 and outputs an output signal F3.

The level detector Ld1 is connected with the node Nb on the side of $V_{BB}$ voltage. The node Nb is located on the side near the noise generating source, i.e., on the right-hand side in the figure from the output transistor PF2. The level detector Ld1 is not connected with the side of $V_{NN}$ voltage.

The level detector Ld2 is connected on the side of $V_{NN}$ voltage with the node Nn near the noise generating source, i.e., the right-hand side in the figure from the output transistor PF1. The input terminal of the level detector Ld1 is not connected with the side of $V_{BB}$ voltage. The source of the output transistor PF1 is not connected with the level detector Ld1 and is connected with the node Nc on the side near the charge pump circuit CP than the position of the output transistor PF2.

The output transistor PF2 prevents current flow from the side of $V_{NN}$ voltage to the side of $V_{BB}$ voltage when noise is generated on the side of $V_{NN}$ voltage and the output transistor PF1 on the side of $V_{NN}$ voltage is set to the conductive state. Accordingly, there is not a problem that the large noise is generated on the side of $V_{BB}$ voltage when the noise is generated on the side of $V_{NN}$ voltage and the output transistor PF1 is set to the conductive state, as shown in FIG. 32, waveform B. When the noise is not generated on the side of $V_{BB}$ voltage, the side of $V_{BB}$ voltage never receives influence of noise from the side of $V_{NN}$ voltage. As mentioned above, the noise which generated on the side of $V_{NN}$ voltage does not run away to the $V_{BB}$ voltage, because the output transistor PF2 is provided. Therefore, the decay time of the noise necessary to recover the $V_{NN}$ voltage shown in FIG. 32, waveform A to the original voltage becomes late, compared with FIG. 6, waveform A.

In this case, when noise is generated on the side of $V_{BB}$ voltage, the output signal F2 from the level detector Ld1 becomes high level. As a result, the signal F3 is generated from the output signal F2 by the level converter Lc4B and is used to set the output transistor PF2 to the conductive state. By this, the noise on the side of $V_{BB}$ voltage is absorbed by the charge pump circuit CP.

Figure 33:
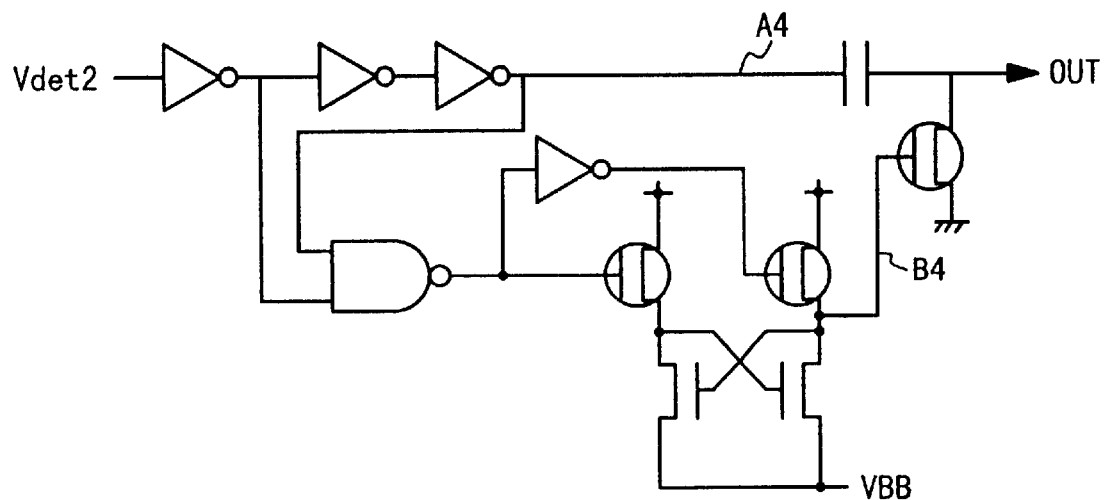
FIG. 33 is a circuit block diagram showing the structure of a first level converter of the power supply voltage generating unit in the fifth embodiment.
Figure 34A:
FIGS. 34A to 34D are timing charts showing signal waveforms at nodes of the first level converter of FIG. 33.
Figure 34B:
Figure 34C:
Figure 34D:

The internal structure of the level converter Lc4A is shown in FIG. 33. FIGS. 34A to 34D are timing charts showing the signal waveforms of nodes A4 and B4 of the level converter Lc4A. As shown in FIG. 33 and FIGS. 34A to 34D, it is supposed that the signal $V_{det2}$ as the signal F4 (FIG. 31) supplied from the level detector Ld2 is in the high level. In this case, the level converter Lc4A supplies the signal of low level (−Vcc) to the gate of the output transistor PF1 as the signal OUT of the output signal F5 to set the output transistor PF1 to the conductive state.

Figure 35:
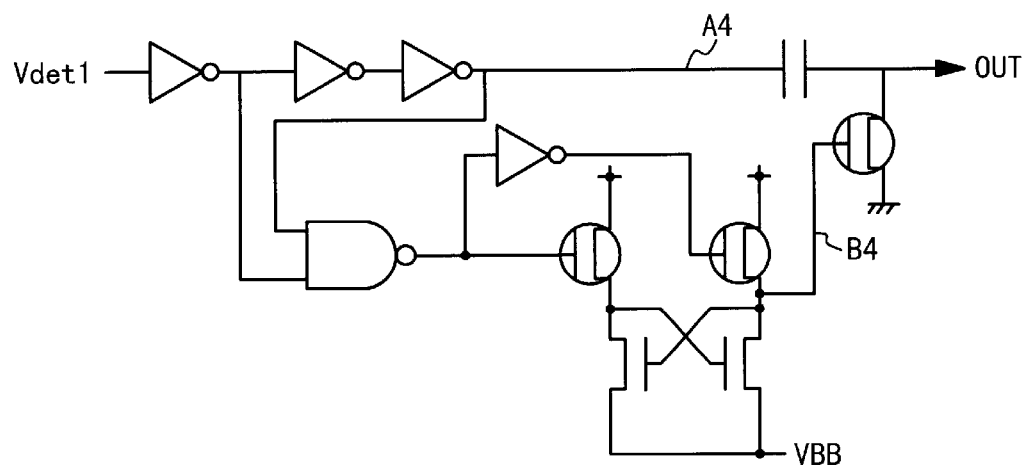
FIG. 35 is a circuit block diagram showing the structure of a second level converter of the power supply voltage generating unit in the fifth embodiment.
Figure 38:
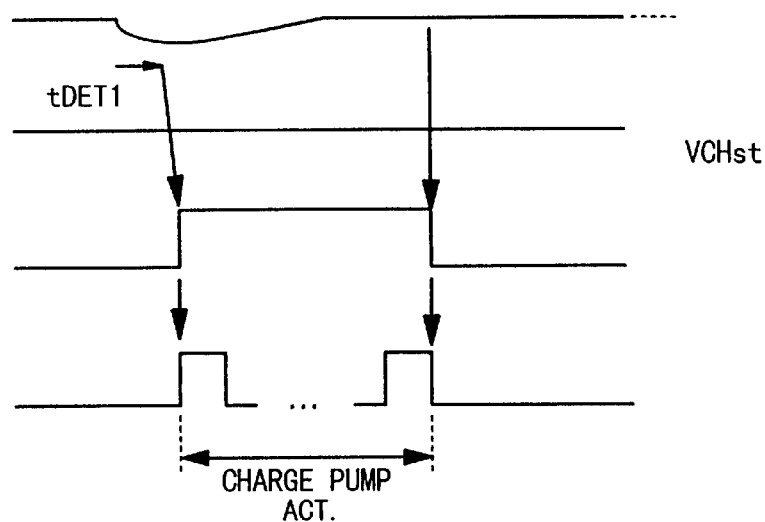
FIG. 38 is a timing charts showing the operation of the power supply voltage generating unit in the sixth embodiment.
Figure 39:
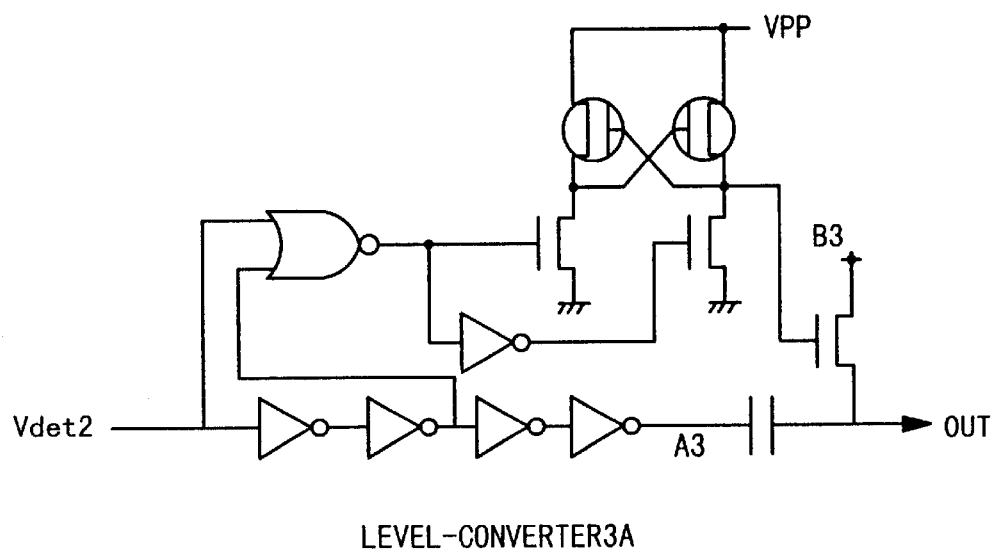
FIG. 39 is a circuit block diagram showing the structure of a first level converter of the power supply voltage generating unit in the sixth embodiment.
Figure 40A:
FIGS. 40A to 40D are timing charts showing signal waveforms at nodes of the first level converter of FIG. 39.
Figure 40B:
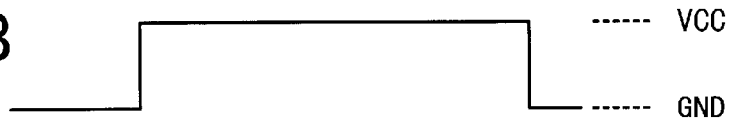
Figure 40C:
Figure 40D:
Figure 41:
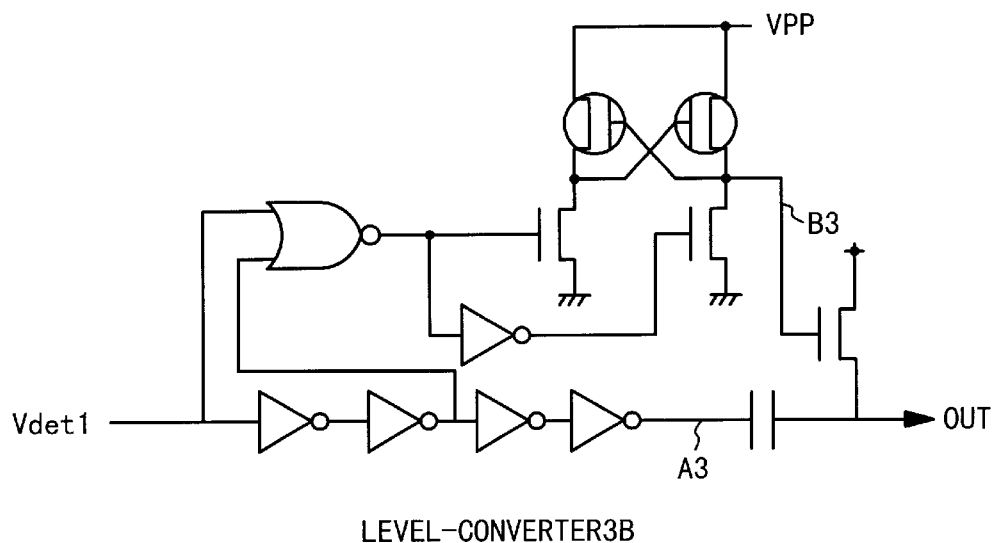
FIG. 41 is a circuit block diagram showing the structure of a second level converter of the power supply voltage generating unit in the sixth embodiment.

The internal structure of the level converter Lc4B is shown in FIG. 35. FIGS. 36A to 36D are timing charts showing the signal waveforms of nodes A4 and B4 of the level converter Lc4B. As shown in FIG. 35 and FIGS. 36A to 36D, when the signal $V_{det2}$ as the signal F4 (FIG. 31) supplied from the level detector Ld2 is in the high level, the level converter Lc4A supplies the signal of low level (−VCC) to the gate of the output transistor PF1 as the signal OUT of the output signal F5 to set the output transistor PF1 to the conductive state.

In the fifth embodiment, the power supply voltage generating unit 40 is described. When a boosted voltage should be generated in place of the negative voltage, only the polarity is changed and the structure and operation are substantially the same as in the fifth embodiment. FIGS. 37 to FIG. 42 show the power supply voltage generating unit to generate the boosted voltage according to the sixth embodiment of the present invention.

FIG. 31 showing the negative voltage generating unit 40 corresponds to FIG. 37 showing the boosted voltage generating unit 40A. FIG. 32 corresponds to FIG. 38, and FIGS. 33A to 33D correspond to FIGS. 34A to 34D. Because the boosted voltage generating unit 40A shown in FIGS. 37 to 42 is only opposed in polarity from the negative voltage generating unit 30 shown FIGS. 31 to 36, the detailed description is omitted.

Figure 43:
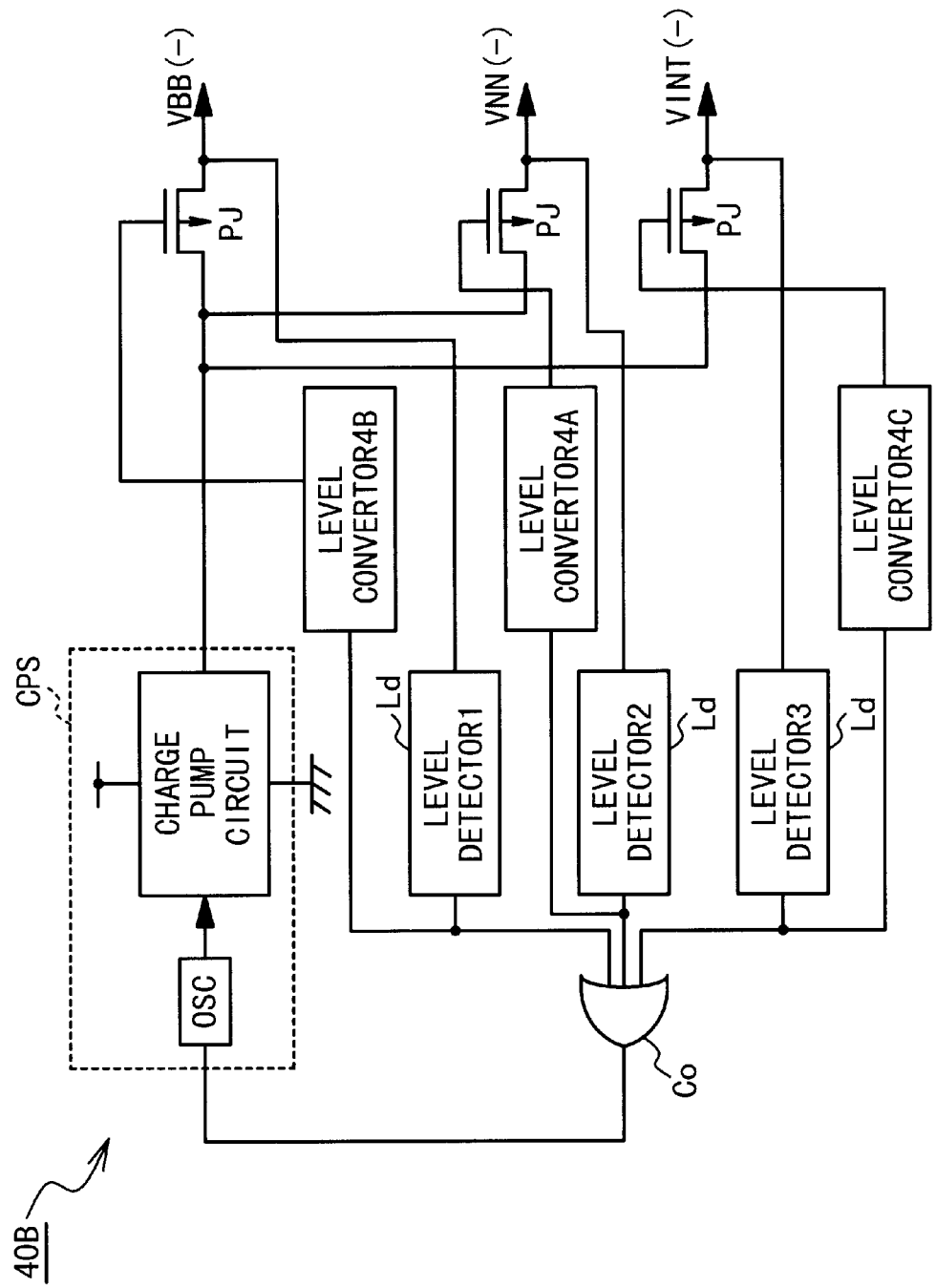
FIG. 43 is a circuit block diagram showing the structure of a modification example of the power supply voltage generating unit according to the fifth or sixth embodiment of the present invention.

It should be noted that in the first to sixth embodiments, two different voltages, the $V_{BB}$ voltage and the $V_{NN}$ voltage, are handled, as shown in FIGS. 5, 25 and 31. In place of the two different voltages, three or more voltages (hereinafter, to be referred to as object voltages) may be handled. By adopting the following structure, the power supply voltage generating unit which can handle three or more w object voltages can be realized. FIG. 43 shows the structure of the power supply voltage generating unit 40B which can handle three object voltages using the power supply voltage generating unit 40 in the fifth embodiment.

A charge pump set CPS composed of a single charge pump circuit CP and a single oscillator OSC is provided. The charge pump circuit CP is connected with each of three or more object voltages, the voltage $V_{BB}$ voltage, the $V_{NN}$ voltage, the voltage $V_{INT}$, . . . and is operable to them. The level detectors Ld corresponding to the number of object voltages (three in the example in FIG. 43) are necessary. The output signal of each of these level detectors Ld is supplied to a single OR circuit Co such that the oscillator OSC is operated in response to the output signal from the OR circuit Co.

When the charge pump circuit CP is connected with each of the object voltages, separating units for separating the object voltages of $V_{BB}$ voltage, $V_{NN}$ voltage, $V_{INT}$, . . . from each other are necessary. The separating units composed of MOS transistors PJ which are connected with the object voltages of $V_{BB}$ voltage, $V_{NN}$ voltage, $V_{INT}$, . . . , respectively.

Each of these output transistors PJ operates in response to a signal generated based on the corresponding object voltage level (a level converted signal obtained through conversion of the output signal from the level detector Ld) to connect the charge pump circuit CP to the corresponding object voltage. It should be noted that in FIG. 43, the separating unit is provided for each of the object voltage of $V_{BB}$ voltage, the $V_{NN}$ voltage, $V_{INT}$ . . . . In place of this structure, the separating units may be provided for the object voltages such as $V_{NN}$ voltage and so on other than one object voltage $V_{BB}$ voltage it which excludes the $V_{BB}$ voltage, like the first to fourth embodiments (FIG. 5 and FIG. 25).

In this case, the following point is important. Here, the case of the power supply voltage generating unit 20 of FIG. 5 will be described as an example.

Figure 44:
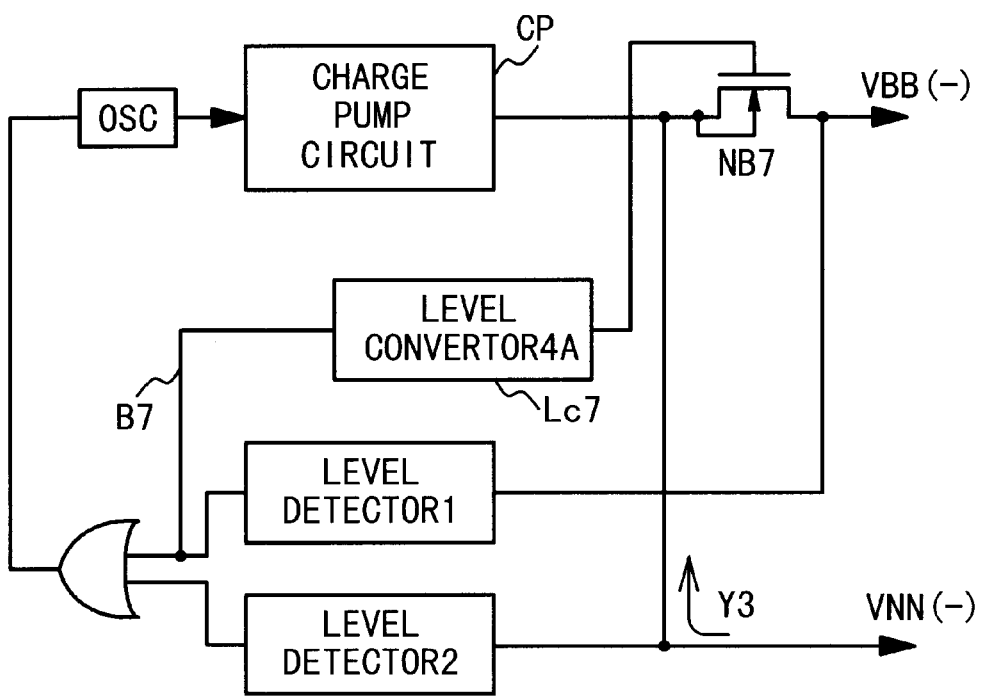
FIG. 44 is a circuit block diagram showing the structure of a separating section of the power supply voltage generating unit according to the first to fourth embodiments of the present invention.

In the power supply voltage generating unit 20 of FIG. 5, the output transistor NB1 and the level converter Lc2 are provided on the side of $V_{NN}$ voltage. The level converter Lc2 operates the output transistor NB1 based on the voltage detection signal B3 of the $V_{NN}$ voltage. In place of this structure, as shown in FIG. 44, it is supposed that the output transistor NB7 and a level converter Lc7 are provided on the side of $V_{BB}$ voltage such that the output transistor NB7 is operated based on t the voltage detection signal B7 of the $V_{BB}$ voltage.

When noise is generated on the side of $V_{BB}$ voltage, the output transistor NB7 is set to the conductive state in response to the $V_{BB}$ voltage detection signal B7 and the charge pump circuit CP absorbs the noise contained on the side of $V_{BB}$ voltage. In this case, the $V_{BB}$ voltage and the $V_{NN}$ voltage are in the relation of $V_{BB}$ voltage<$V_{NN}$ voltage as mentioned above. Therefore, when the charge pump circuit CP absorbs the noise on the side of $V_{BB}$ voltage, the $V_{NN}$ voltage is decreased (see an arrow Y3). As a result, when the noise contained in the $V_{BB}$ voltage is removed and recovers to the original voltage, the $V_{NN}$ voltage is decreased to the same level as the $V_{BB}$ voltage.

For this reason, the separating units (output transistors) should be provided on the side of the object voltages to avoid the influence of the charge pump circuit CP in the normal state, or when noise is not generated. The separating units should be provided on the side of the higher object voltages, e.g., the $V_{NN}$ voltage in the negative voltage generating unit 20 or 30 shown in FIG. 5 or FIG. 25. In the boosted voltage generating unit 20A or 30A shown in FIG. 15 or 28, the separating units are provided on the side of the lower object voltages, e.g., the $V_{CH}$ voltage. In this way, the charge pump circuit CP never changes the object voltage in which the noise is generated.

Also, when the power supply voltage generating unit 20 of FIG. 5 is described using as an example, the output transistor NB1 should be provided on the side of $V_{NN}$ voltage in the power supply voltage generating unit 20 from the following viewpoint different from the above, as shown in FIG. 5.

As mentioned above, a circuit group is connected with the side of $V_{NN}$ voltage. Therefore, the side of $V_{NN}$ voltage is easy for noise to be contained, compared with the side of $V_{BB}$ voltage as the substrate voltage. When noise is contained on the side of $V_{NN}$ voltage, the output transistor NB1 is set to the conductive state immediately before operation of the charge pump circuit CP, and the noise on the side of $V_{NN}$ voltage moves to the side of $V_{BB}$ voltage lower than the $V_{NN}$ voltage through the output transistor NB1 without the operation of the charge pump circuit CP. Thus, the noise on the side of $V_{NN}$ voltage is more quickly removed.

According to the semiconductor device of the present invention, the decay time of the noise can be made short. Also, according to the semiconductor device of the present invention, the movement of the noise generated on the side of a first voltage such as the $V_{NN}$ voltage and the $V_{CH}$ voltage to a second voltage such as the $V_{BB}$ voltage and the $V_{PP}$ voltage can be restrained.

What is claimed is:

1. A semiconductor device comprising:
   a voltage generating section operatively connected with a first voltage line portion and a second voltage line portion;
   a first voltage detecting section which detects a voltage of said first voltage line portion;
   a second voltage detecting section which detects a voltage of said second voltage line portion;
   a control unit which controls said voltage generating section based on the detecting results of said first and second voltage detecting sections such that said first voltage line portion and said second voltage line portion are respectively set to a first voltage and a second voltage; and a switch section provided between said first voltage line portion and said second voltage line portion, wherein said switch section selectively disconnects the second voltage line portion from said first voltage line portion based on said detection result of said second voltage detecting section.

2. A semiconductor device according to claim 1, wherein said switch section operates to prevent said second voltage line portion voltage from changing from a second voltage due to said voltage generating section when said second voltage line portion voltage is set to said second voltage.

3. A semiconductor device according to claim 1, wherein said voltage generating section generates a negative first voltage, and said second voltage is higher than said first voltage.

4. A semiconductor device according to claim 1, wherein said voltage generating section generates a boosted voltage, and said second voltage is lower than said first voltage.

5. A semiconductor device according to claim 1, further comprising:
a connecting section provided between an output terminal of said voltage generating section and said switch section to connect said first voltage line portion and said second voltage line portion.

6. A semiconductor device according to claim 1, further comprising:
an auxiliary switch section provided between said voltage generating section and said first voltage line portion, to selectively disconnect an output terminal from said first voltage line portion based on the detection result of said first voltage detecting section.

7. A semiconductor device according to claim 6, wherein said auxiliary switch section operates to prevent said voltage of said first voltage line portion from changing due to said voltage of said second voltage line portion when said voltage of said second voltage line portion is different from said second voltage.

8. A semiconductor device according to claim 1, wherein said control unit controls said voltage generating section to operate when at least one of said first voltage line portion and said second voltage line portion is different from a corresponding one of said first voltage and said second voltage.

9. A semiconductor device comprising:
a voltage generating section connected at an output terminal with first and second voltage line portions; and
a control unit which controls said voltage generating section such that said first voltage line portion and said second voltage line portion are respectively set to a first voltage and a second voltage, and
wherein when one of said first voltage line portion and said second voltage line portion is different from a corresponding one of said first voltage and said second voltage, said control unit controls said voltage generating section to generate a voltage directly to said one of said first voltage line portion and said second voltage line portion without passing through the other of said first voltage line portion and said second voltage line portion.

10. A semiconductor device according to claim 9, wherein said control unit controls said voltage generating section to operate when at least one of said first voltage line portion and said second voltage line portion is different from a corresponding one of said first voltage and said second voltage.

11. A semiconductor device comprising:
a voltage generating section connected at an output terminal with a first voltage line portion and a second voltage line portion and outputting a voltage from said output terminal in response to a control signal;
a first voltage detecting section which outputs a first detection signal when a voltage of said first voltage line portion is different from a first voltage;
a second voltage detecting section which outputs a second detection signal when a voltage of said second voltage line portion is different from a second voltage;
a control signal outputting section which outputs said control signal to said voltage generating section in response to at least one of said first detection signal and said second detection signal;
a wiring line which connects said first voltage line portion and said second voltage line portion;
a MOS transistor provided between a node connected to said wiring line and said second voltage line portion, to connect said node and said second voltage line portion in response to an operation signal; and
an operation signal generating section which generates said operation signal based on said second detection signal.

12. A semiconductor device comprising:
a voltage generating section connected at an output terminal with a first voltage line portion and a second voltage line portion and outputting a voltage from said output terminal in response to a control signal;
a first voltage detecting section which outputs a first detection signal when a voltage of said first voltage line portion is different from a first voltage;
a second voltage detecting section which outputs a second detection signal when a voltage of said second voltage line portion is different from a second voltage;
a control signal outputting section which outputs said control signal to said voltage generating section in response to at least one of said first detection signal and said second detection signal;
a first MOS transistor provided to connect said output terminal of said voltage generating section to said first voltage line portion in response to a first operation signal;
a second MOS transistor provided to connect said output terminal of said voltage generating section and said second voltage line portion in response to a second operation signal;
a first operation signal generating section which generates said first operation signal based on said first detection signal; and
a second operation signal generating section which generates said second operation signal based on said second detection signal.

* * * * *